(12) United States Patent
Abedin et al.

(10) Patent No.: US 12,677,465 B2
(45) Date of Patent: Jul. 7, 2026

(54) SOURCE/DRAIN EXTENSION WITH SPACER LAYERS

(71) Applicant: International Business Machines Corporation, Armonk, NY (US)

(72) Inventors: Minhaz Abedin, Albany, NY (US); Ruilong Xie, Niskayuna, NY (US); Tao Li, Slingerlands, NY (US); Julien Frougier, Albany, NY (US); Mohammad Hasanuzzaman, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 18/542,956

(22) Filed: Dec. 18, 2023

(65) Prior Publication Data

US 2025/0204002 A1 Jun. 19, 2025

(51) Int. Cl.
*H10D 64/23* (2025.01)
*H10D 30/43* (2025.01)
(Continued)

(52) U.S. Cl.
CPC ........... *H10D 64/254* (2025.01); *H10D 30/43* (2025.01); *H10D 30/6735* (2025.01);
(Continued)

(58) Field of Classification Search
CPC .. H10D 64/254; H10D 30/43; H10D 30/6735; H10D 30/6757; H10D 84/83; H10D 62/151; H10D 30/0198; H10D 64/017;
H10D 64/251; H10D 84/83125; H10D 84/8312; H10D 30/014; H10D 84/832; H10D 62/121; H10W 20/069; H10W 20/481
See application file for complete search history.

(56) References Cited

U.S. PATENT DOCUMENTS 9,847,390 B1 12/2017 Xie et al.
10,236,218 B1 3/2019 Xie et al.
(Continued)

OTHER PUBLICATIONS

Disclosed Anonymously, "Source Drain Isolation for CMOS Nanosheet with Bottom Antidoping Prior to EPI Growth," IPCOM000254275D, ip.com, Jun. 14, 2018, 6 pages.
(Continued)

*Primary Examiner* — Julia Slutsker
(74) *Attorney, Agent, or Firm* — Samuel Waldbaum; Ryan, Mason & Lewis, LLP

(57) ABSTRACT

A semiconductor structure includes a first nanosheet field-effect transistor device having a plurality of first nanosheet channel layers disposed on a substrate, a second nanosheet field-effect transistor device adjacent the first field-effect transistor nanosheet device, the second field-effect transistor nanosheet device having a plurality of second nanosheet channel layers disposed on the substrate, a first source/drain region disposed between opposing sidewalls of the plurality of first nanosheet channel layers and the plurality of second nanosheet channel layers and extending into the substrate, and source/drain sidewall spacers disposed on sidewalls of the first source/drain region extending into the substrate.

20 Claims, 18 Drawing Sheets

(51) Int. Cl.

| | |
|---|---|
| *H10D 30/67* | (2025.01) |
| *H10D 62/10* | (2025.01) |
| *H10D 84/83* | (2025.01) |
| *H10W 20/41* | (2026.01) |

(52) U.S. Cl.
CPC ....... *H10D 30/6757* (2025.01); *H10D 62/121* (2025.01); *H10D 84/83* (2025.01); *H10W 20/427* (2026.01)

(56) References Cited

U.S. PATENT DOCUMENTS

| | | | | |
|---|---|---|---|---|
| 10,431,651 | B1 | 10/2019 | Chao et al. | |
| 10,714,567 | B2 | 7/2020 | Frougier et al. | |
| 10,756,216 | B2 | 8/2020 | Miao et al. | |
| 10,804,398 | B2 | 10/2020 | Frougier et al. | |
| 10,916,627 | B2 | 2/2021 | Loubet et al. | |
| 11,444,200 | B2 | 9/2022 | Huang et al. | |
| 11,532,522 | B2 | 12/2022 | More et al. | |
| 11,588,052 | B2 | 2/2023 | Guha et al. | |
| 11,688,637 | B2 | 6/2023 | Mehandru | |
| 11,710,739 | B2 | 7/2023 | Yang et al. | |
| 2021/0391421 | A1* | 12/2021 | Chu | H10D 62/116 |
| 2022/0122893 | A1 | 4/2022 | Lai et al. | |
| 2023/0067715 | A1* | 3/2023 | Yuh | H10B 61/22 |
| 2023/0114216 | A1 | 4/2023 | Li et al. | |
| 2023/0361176 | A1* | 11/2023 | Chang | H10D 62/121 |

OTHER PUBLICATIONS

Disclosed Anonymously, "Method and Structure for Providing Void Free Source Drain Epitaxy for Nanosheet Devices," IPCOM000259334D, ip.com, Jul. 31, 2019, 6 pages.

* cited by examiner

100

144

148
146
144
138
136

112
110
102

100

144
118
136
108-3
108-2
108-1
122

148
146
138
144
142
118
140

136
128
134
102

W1
W2

100

148
146
144
138
136
112
110
102
144

100

144
118
136
108-3
108-2
108-1
122
164

148
146
138
144
142
118
140
136
128
102
134
162

SOURCE/DRAIN EXTENSION WITH SPACER LAYERS

BACKGROUND

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

Illustrative embodiments of the present application include techniques for use in semiconductor manufacture. In an illustrative embodiment, a semiconductor structure comprises a first nanosheet field-effect transistor device comprising a plurality of first nanosheet channel layers disposed on a substrate, a second nanosheet field-effect transistor device adjacent the first field-effect transistor nanosheet device, the second field-effect transistor nanosheet device comprising a plurality of second nanosheet channel layers disposed on the substrate, a first source/drain region disposed between opposing sidewalls of the plurality of first nanosheet channel layers and the plurality of second nanosheet channel layers and extending into the substrate, and source/drain sidewall spacers disposed on sidewalls of the first source/drain region extending into the substrate.

The semiconductor structure of the illustrative embodiment advantageously has source/drain sidewall spacers disposed on sidewalls of a source/drain region extending into the substrate. The source/drain sidewall spacers disposed on sidewalls of a source/drain region extending into the substrate improves leakage off-current, which in turn reduces overall system power consumption. In addition, a source/drain region grown from a bulk substrate may also have stress benefits, which in turn improves transistor performance by increasing on-current.

In one or more additional illustrative embodiments, as may be combined with the preceding paragraphs, the substrate comprises a bulk silicon substrate.

In one or more additional illustrative embodiments, as may be combined with the preceding paragraphs, the bulk silicon substrate comprises a first crystalline structure and the first source/drain region comprises a second crystalline structure matching the first crystalline structure.

In one or more additional illustrative embodiments, as may be combined with the preceding paragraphs, the first source/drain region is an epitaxial grown first source/drain region.

In one or more additional illustrative embodiments, as may be combined with the preceding paragraphs, the first source/drain region disposed between the opposing sidewalls of the plurality of first nanosheet channel layers and the plurality of second nanosheet channel layers comprises a first width and the first source/drain region extending into the substrate comprises a second width different than the first width.

In one or more additional illustrative embodiments, as may be combined with the preceding paragraphs, the semiconductor structure further comprises a backside contact placeholder layer disposed between a bottom surface of the first source/drain region and a top surface of the substrate.

In one or more additional illustrative embodiments, as may be combined with the preceding paragraphs, the semiconductor structure further comprises a frontside source/drain contact connecting the first source/drain region to a frontside back-end-of-the-line interconnect.

In one or more additional illustrative embodiments, as may be combined with the preceding paragraphs, the semiconductor structure further comprises a third nanosheet field-effect transistor device adjacent the second field-effect transistor nanosheet device, the third field-effect transistor nanosheet device comprising a plurality of third nanosheet channel layers disposed on the substrate, a second source/drain region disposed between opposing sidewalls of the plurality of second nanosheet channel layers and the plurality of third nanosheet channel layers and extending into the substrate and a backside interlevel dielectric layer, and a backside contact disposed on a portion of sidewalls and a bottom surface of the second source/drain region extending into the backside interlevel dielectric layer.

In one or more additional illustrative embodiments, as may be combined with the preceding paragraphs, the second source/drain region disposed between the opposing sidewalls of the plurality of second nanosheet channel layers and the plurality of third nanosheet channel layers comprises a first width and the second source/drain region extending into the substrate and the backside interlevel dielectric layer comprises a second width different than the first width.

According to another exemplary embodiment, a semiconductor structure comprises a first nanosheet field-effect transistor device comprising a plurality of first nanosheet channel layers disposed on a backside interlevel dielectric layer, a second nanosheet field-effect transistor device adjacent the first field-effect transistor nanosheet device, the second field-effect transistor nanosheet device comprising a plurality of second nanosheet channel layers disposed on the backside interlevel dielectric layer, a first source/drain region disposed between opposing sidewalls of the plurality of first nanosheet channel layers and the plurality of second nanosheet channel layers and extending into the backside interlevel dielectric layer, first source/drain sidewall spacers disposed on a portion of sidewalls of the first source/drain region extending into the backside interlevel dielectric layer, and a backside contact disposed on remaining portions of the sidewalls and a bottom surface of the first source/drain region extending into the backside interlevel dielectric layer.

The semiconductor structure of the illustrative embodiment advantageously has source/drain sidewall spacers disposed on a portion of sidewalls of a source/drain region extending into a backside interlevel dielectric layer, and a backside contact disposed on remaining portions of the sidewalls and a bottom surface of the first source/drain region extending into the backside interlevel dielectric layer. The partial wrap of the backside contact reduces capacitance on the frontside of the semiconductor structure. In addition, the source/drain sidewall spacers improve leakage off-current, which in turn also improves performance.

In one or more additional illustrative embodiments, as may be combined with the preceding paragraphs, the backside contact connects the first source/drain region to a backside interconnect.

In one or more additional illustrative embodiments, as may be combined with the preceding paragraphs, the first source/drain region disposed between the opposing sidewalls of the plurality of first nanosheet channel layers and the plurality of second nanosheet channel layers comprises a first width and the first source/drain region extending into the backside interlevel dielectric layer comprises a second width different than the first width.

In one or more additional illustrative embodiments, as may be combined with the preceding paragraphs, the semiconductor structure further comprises a third nanosheet field-effect transistor device adjacent the second field-effect transistor nanosheet device, the third field-effect transistor nanosheet device comprising a plurality of third nanosheet channel layers disposed on the backside interlevel dielectric layer, and a second source/drain region disposed between opposing sidewalls of the plurality of second nanosheet channel layers and the plurality of third nanosheet channel layers.

In one or more additional illustrative embodiments, as may be combined with the preceding paragraphs, the semiconductor structure further comprises a frontside source/drain contact connecting the second source/drain region to a frontside back-end-of-the-line interconnect.

In one or more additional illustrative embodiments, as may be combined with the preceding paragraphs, the second source/drain region is further disposed on a flowable dielectric layer.

In one or more additional illustrative embodiments, as may be combined with the preceding paragraphs, the first source/drain region further extends into a substrate disposed between the backside interlevel dielectric layer and the plurality of first nanosheet channel layers and the plurality of second nanosheet channel layers.

Another exemplary embodiment comprises an integrated circuit comprising one or more semiconductor structures. At least one of the one or more semiconductor structures is a semiconductor structure according to one or more of the foregoing illustrative embodiments.

The integrated circuit of the illustrative embodiment advantageously allows for the semiconductor structure having source/drain sidewall spacers disposed on sidewalls of a source/drain region extending into the substrate. The source/drain sidewall spacers disposed on sidewalls of a source/drain region extending into the substrate improves leakage off-current, which in turn reduces overall system power consumption. In addition, a source/drain region grown from a bulk substrate may also have stress benefits, which in turn improves transistor performance by increasing on-current.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figures 1A, 1B, 1C:
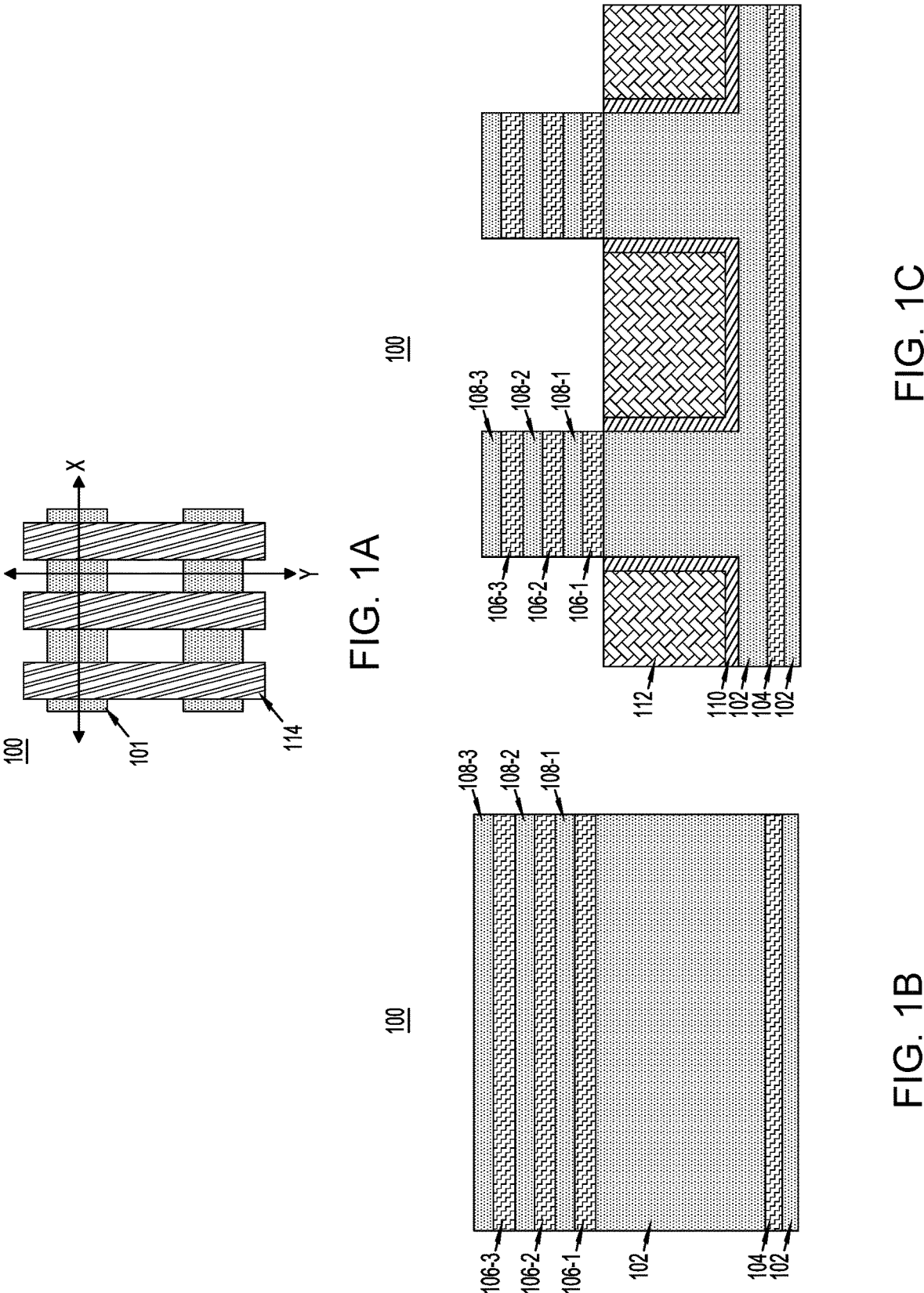
FIG. 1A is a top-down view of a semiconductor structure at an intermediate step of a method of fabricating a nanosheet transistor structure according to an embodiment of the invention.
FIG. 1B is a cross-sectional view of the semiconductor structure taken along the X-X axis of FIG. 1A, according to an illustrative embodiment.
FIG. 1C is a cross-sectional view of the semiconductor structure taken along the Y-Y axis of FIG. 1A, according to an illustrative embodiment.

This disclosure relates generally to semiconductor devices, and more particularly to semiconductor structures having a source/drain extension in the semiconductor substrate with isolation layers on its sidewalls, and methods for their fabrication. However, it is to be understood that embodiments of the present disclosure are not limited to the illustrative methods, apparatus, systems and devices but instead are more broadly applicable to other suitable methods, apparatus, systems and devices.

Bulk (silicon) nano-sheet transistor integration faces the challenge of controlling the silicon etch depth usually leading to higher etch depth into the silicon. However, a deeper etch depth results in a deeper source/drain region (epi region) depth in the silicon. As a result, a source to drain leakage current increases, which in turn, is detrimental to the semiconductor device and overall system performance. Thus, there is a need for a new semiconductor device structure and method to prevent or reduce the source to drain leakage current.

Accordingly, the illustrative embodiments of the present disclosure overcome the foregoing drawbacks by forming source/drain regions having a source/drain extension in the substrate with source/drain sidewall spacers. The source/drain sidewall spacers disposed on sidewalls of a source/drain region extending into the substrate improves leakage off-current, which in turn reduces overall system power consumption. In addition, a source/drain region grown from a bulk substrate may also have stress benefits, which in turn improves transistor performance by increasing on-current.

Detailed embodiments of the semiconductor structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof are to be broadly construed to relate to the disclosed structures and methods, as oriented in the drawings, wherein such structures may be understood to have the same configuration (e.g., layers stacked in the same order) even if the structure is rotated to a different angle from that shown in the drawings.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

It is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the interest of not obscuring the presentation of the embodiments of the present disclosure, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present disclosure, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include, but are not limited to, physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The patterns created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

Referring now to the drawings in which like numerals represent the same of similar elements, FIGS. 1A-18B illustrate various processes for fabricating semiconductor structures with logic device region and high voltage device region structures. Note that the same reference numeral (100) is used to denote the semiconductor structure through the various intermediate fabrication stages illustrated in FIGS. 1A-18B. Note also that the semiconductor structures described herein can also be considered to be a semiconductor device and/or an integrated circuit, or some part thereof. For the purpose of clarity, some fabrication steps leading up to the production of the semiconductor structures as illustrated in FIGS. 1A-18B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Referring now to FIGS. 1A-1C, FIG. 1A shows a top-down view illustrating where the cross-sectional views are taken in a semiconductor structure 100. FIG. 1A shows a fin active region 101 for the semiconductor structure 100, along with gate regions 114. FIGS. 1B and 1C show a cross-sectional view of the taken along the lines at the X-X axis and the Y-Y axis in the top-down view of FIG. 1A.

Referring now to FIGS. 1B and 1C, the semiconductor structure 100 is shown during an intermediate step of a method of fabricating a nanosheet transistor structure according to an embodiment of the invention. The semiconductor structure 100 includes a substrate 102. The substrate 102 may be formed of any suitable semiconductor material, including various silicon-containing materials including, but not limited to, silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon. In some embodiments, the substrate 102 can be doped.

An etch stop layer 104 can be formed in the substrate 102. The etch stop layer 104 may comprise a buried oxide (BOX) layer or silicon germanium (SiGe), or another suitable material such as a III-V semiconductor epitaxial layer.

Nanosheets are initially formed over the substrate 102, where the nanosheets include sacrificial layers 106-1, 106-2 and 106-3 (collectively, the sacrificial layers 106), and nanosheet channel layers 108-1, 108-2 and 108-3 (collectively, the nanosheet channel layers 108). The sacrificial layers 106 are illustratively formed of different sacrificial materials, such that they may be etched or otherwise removed selective to one another. In some embodiments, the sacrificial layers 106 are formed of SiGe, but with different percentages of Ge. For example, certain ones of the sacrificial layers 106 may have a relatively higher percentage of Ge (e.g., 55% Ge), and other ones of the sacrificial layers 106 may have a relatively lower percentage of Ge (e.g., 33% Ge or 25% Ge). For example, the sacrificial layers 106-1 may have a relatively higher percentage of Ge (e.g., 55% Ge), and the sacrificial layers 106-2 may have a relatively lower percentage of Ge (e.g., 25% Ge). Other combinations of different sacrificial materials may be used in other embodiments.

The nanosheet channel layers 108 may be formed of Si or another suitable material (e.g., a material similar to that used for the substrate 102).

The semiconductor structure 100 is further shown following patterning of the sacrificial layer 106 and the nanosheet channel layers 108 using known lithographic, patterning and etching processes to form shallow trench isolation (STI) regions 112 in FIG. 1C. STI regions 112 may be formed of a dielectric material such as silicon dioxide (SiO₂), silicon oxycarbide (SiOC), silicon oxynitride (SiON), etc. STI regions 112 further include a STI liner layer 110 composed of, for example, SiCO, SiOCN and silicon nitride (SiN).

Figures 2A, 2B:
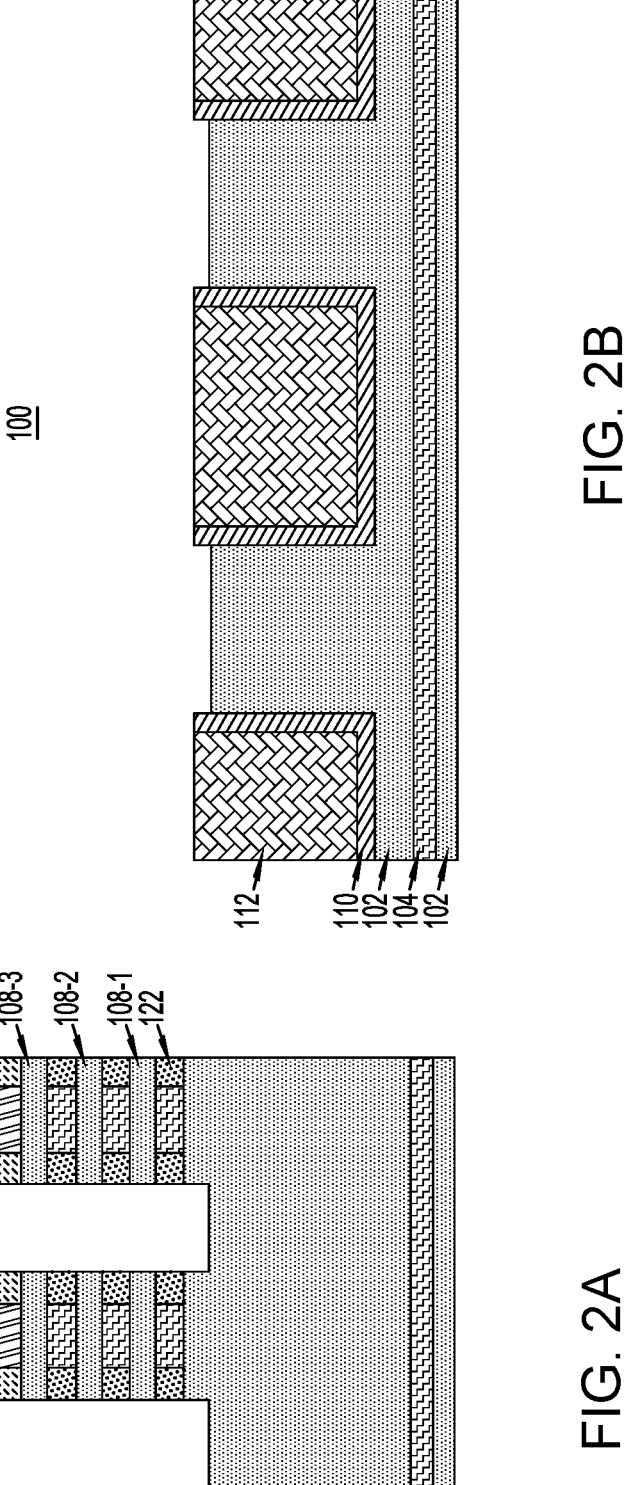
FIG. 2A is a cross-sectional view of the semiconductor structure taken along the X-X axis of FIG. 1A for use at a second-intermediate fabrication stage, according to an illustrative embodiment.
FIG. 2B is a cross-sectional view of the semiconductor structure taken along the Y-Y axis of FIG. 1A for use at the second-intermediate fabrication stage, according to an illustrative embodiment.

Referring now to FIGS. 2A and 2B, the semiconductor structure 100 is shown following formation of a dummy gate layer 114, gate sidewall spacers 118, a gate hardmask (HM) layer 120 and inner spacers 122, according to an embodiment of the invention. The dummy gate layer 114 is formed by first depositing and planarizing a layer of dummy gate material on the top-most nanosheet channel layer 108-3. In some embodiments, the dummy gate material can be polycrystalline Si. In some embodiments, the dummy gate material can be amorphous silicon (a-Si) or amorphous silicon germanium (a-SiGe). After being deposited, the dummy gate material is planarized (e.g., by CMP) to a desired level. Dummy gate stacks 116a, 116b and 116c are formed by depositing the gate HM layer 120 on the dummy gate layer 114 using conventional deposition techniques such as ALD. Suitable material for the gate HM layer 120 includes, for example, oxide and nitride materials such as silicon nitride (SiN), a multi-layer of SiN and SiO₂, or other suitable material. The gate HM layer 120 is then patterned followed by lithographic processing to result in the dummy gate stacks 116a, 116b and 116c composed of patterned gate HM layer 120 and the underlying dummy gate layer 114 as shown in FIG. 2A. The dummy gate layer 114 is selectively etched such that portions of the dummy gate layer 114 that are not under the gate HM layer 120 are removed.

The gate sidewall spacers 118 on sidewalls of the dummy gate layer 114 and the gate HM layer 120 are formed by conformal dielectric liner deposition. In some embodiments, the dielectric material for forming the gate sidewall spacers 118 can be any suitable dielectric material including, for example, silicon oxide, silicon nitride, silicon oxynitride, SiBCN, SiOCN, SiOC, or any suitable combination of those materials. In some embodiments, the dielectric material can be a low-k dielectric material.

The inner spacers 122 are formed by using known semiconductor device fabrication processes. For example, portions of the sacrificial layers 106 are removed forming indent spaces, followed by depositing a dielectric material herein to form the inner spacers 122 in the end region cavities (not shown) formed in the end regions of the sacrificial layers 106 (see FIG. 2A). In some embodiments, a conformal deposition process is used to deposit a dielectric material over the end region cavities such that the dielectric material pinches off in the end region cavities to form the inner spacers 122. A subsequent isotropic or anisotropic etch back is performed to remove excess dielectric material on exposed vertical and horizontal surfaces of the semiconductor structure 100. Suitable material for the inner spacers 122 includes, for example, silicon nitride (SiN), SiBCN, silicon carbide oxide (SiCO), SiOCN or any other type of dielectric material (e.g., a dielectric material having a dielectric constant k of less than about 5).

Figures 3A, 3B:
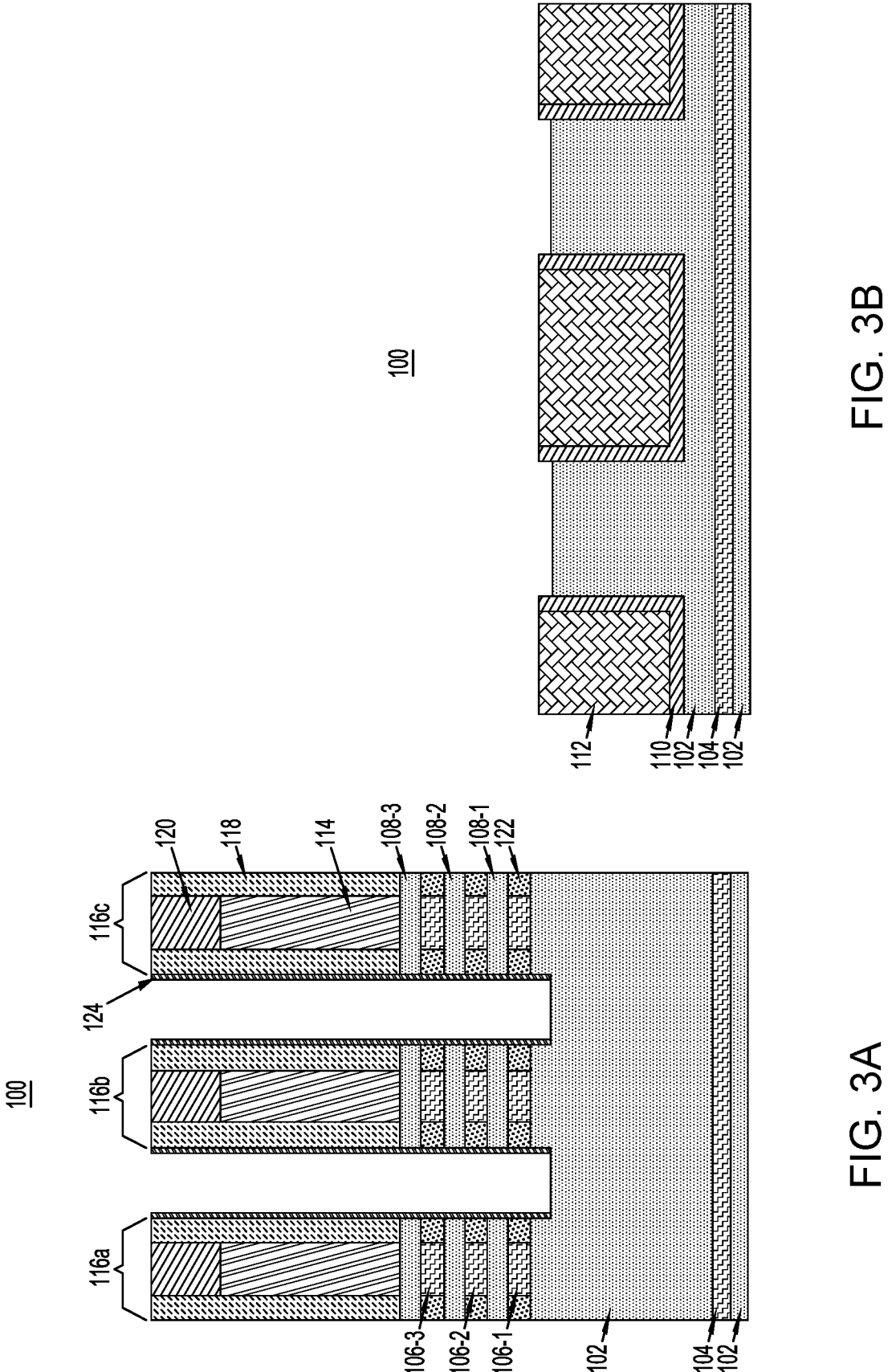
FIG. 3A is a cross-sectional view of the semiconductor structure taken along the X-X axis of FIG. 1A for use at a third-intermediate fabrication stage, according to an illustrative embodiment.
FIG. 3B is a cross-sectional view of the semiconductor structure taken along the Y-Y axis of FIG. 1A for use at the third-intermediate fabrication stage, according to an illustrative embodiment.

Referring now to FIGS. 3A and 3B, the semiconductor structure 100 is shown following formation of a protective liner layer 124 on opposing sidewalls of the dummy gate layer 114, gate sidewall spacers 118, the gate HM layer 120, the nanosheet channel layers 108 and the inner spacers 122 to protect the lateral sides of these portions of the semiconductor structure 100 from being damaged during the performance of subsequent fabrication processes, according to an embodiment of the invention. The protective liner layer 124 can be formed using known deposition techniques such as, for example, ALD, PVD, etc. Suitable material for the protective liner layer 124 includes, for example, SiOC, SiCN, SiN, SiBCN, etc.

Figures 4A, 4B:
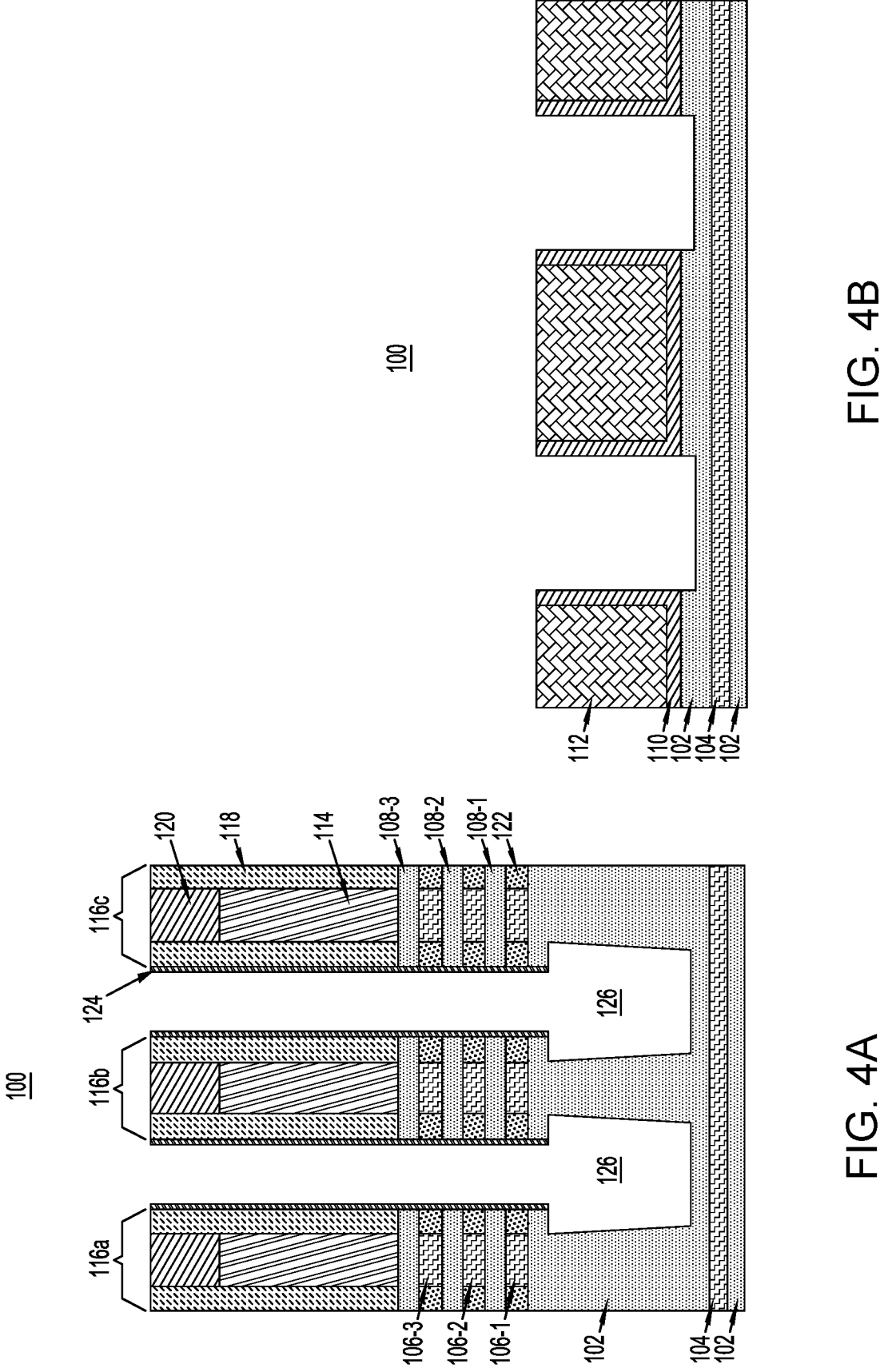
FIG. 4A is a cross-sectional view of the semiconductor structure taken along the X-X axis of FIG. 1A for use at a fourth-intermediate fabrication stage, according to an illustrative embodiment.
FIG. 4B is a cross-sectional view of the semiconductor structure taken along the Y-Y axis of FIG. 1A for use at the fourth-intermediate fabrication stage, according to an illustrative embodiment.

Referring now to FIGS. 4A and 4B, the semiconductor structure 100 is shown following formation of openings 126 in the substrate 102, according to an embodiment of the invention. The openings 126 can be formed using a lateral etching process, for example, using a dry etch or a wet etch process.

Figures 5A, 5B:
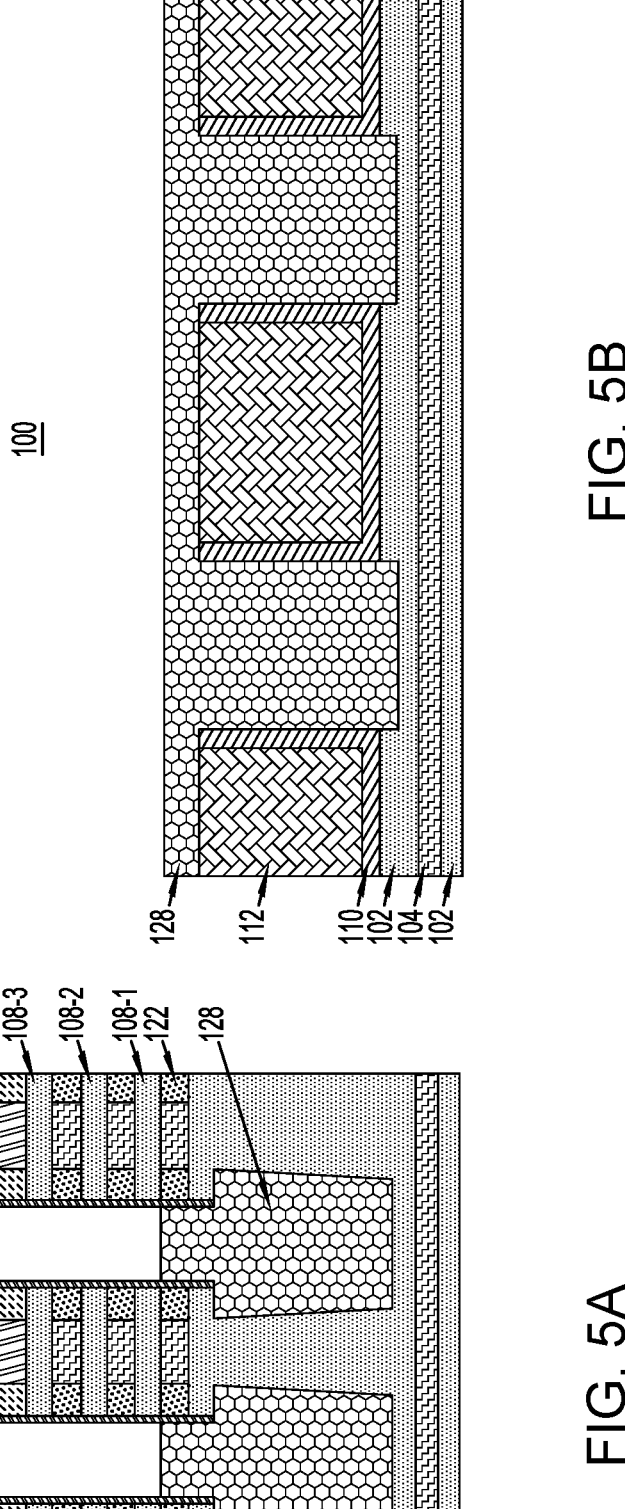
FIG. 5A is a cross-sectional view of the semiconductor structure taken along the X-X axis of FIG. 1A for use at a fifth-intermediate fabrication stage, according to an illustrative embodiment.
FIG. 5B is a cross-sectional view of the semiconductor structure taken along the Y-Y axis of FIG. 1A for use at the fifth-intermediate fabrication stage, according to an illustrative embodiment.

Referring now to FIGS. 5A and 5B, the semiconductor structure 100 is shown following formation of a spacer layer structure 128, according to an embodiment of the invention. The spacer layer structure 128 can be composed of a flowable dielectric material such as, for example, a flowable dielectric oxide such as $SiO_2$, SiOC, etc. and the spacer layer structure 128 can be formed by deposition of the flowable dielectric material, followed by a recess etch.

Figures 6A, 6B:
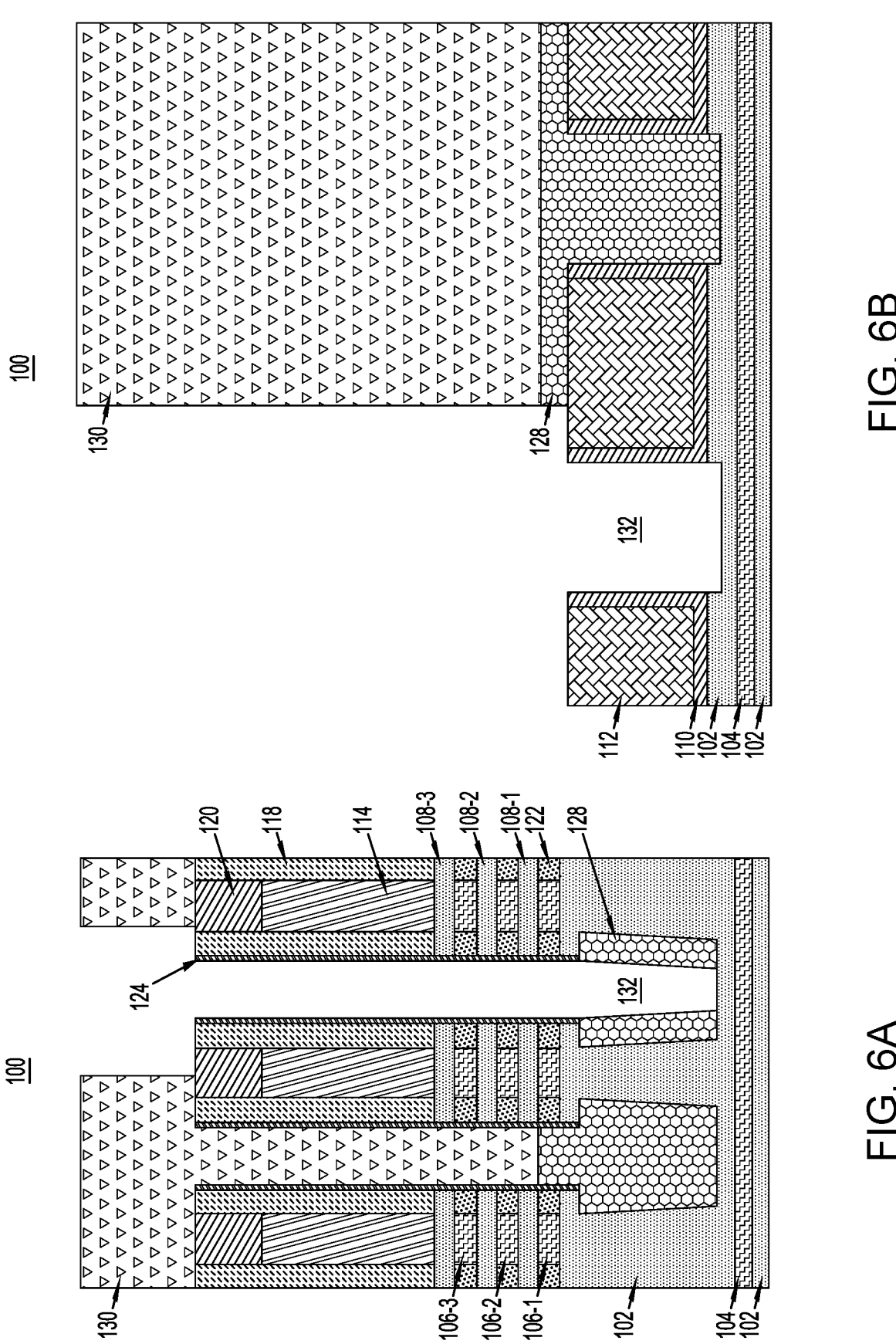
FIG. 6A is a cross-sectional view of the semiconductor structure taken along the X-X axis of FIG. 1A for use at a sixth-intermediate fabrication stage, according to an illustrative embodiment.
FIG. 6B is a cross-sectional view of the semiconductor structure taken along the Y-Y axis of FIG. 1A for use at the sixth-intermediate fabrication stage, according to an illustrative embodiment.

Referring now to FIGS. 6A and 6B, the semiconductor structure 100 is shown following formation of a mask layer 130, followed by forming openings 132, according to an embodiment of the invention. The mask layer 130 (such as an organic planarization layer (OPL) or a spin-on-carbon (SOC)) is deposited on the spacer layer structure 128 using spin-on coating or any other suitable deposition process. Next, the mask layer 130 is patterned and a selective etch process such as RIE can be carried out to selectively remove the exposed portion of the mask layer 130 and the spacer layer structure 128 to form the openings 132. FIG. 6A shows that a portion of the spacer layer structure 128 remains on sidewalls of the substrate 102 and a top surface of the substrate is exposed. FIG. 6B shows that STI liner layer 110 and a top surface of the substrate 102 is exposed in the given opening of openings 132.

Figures 7A, 7B:
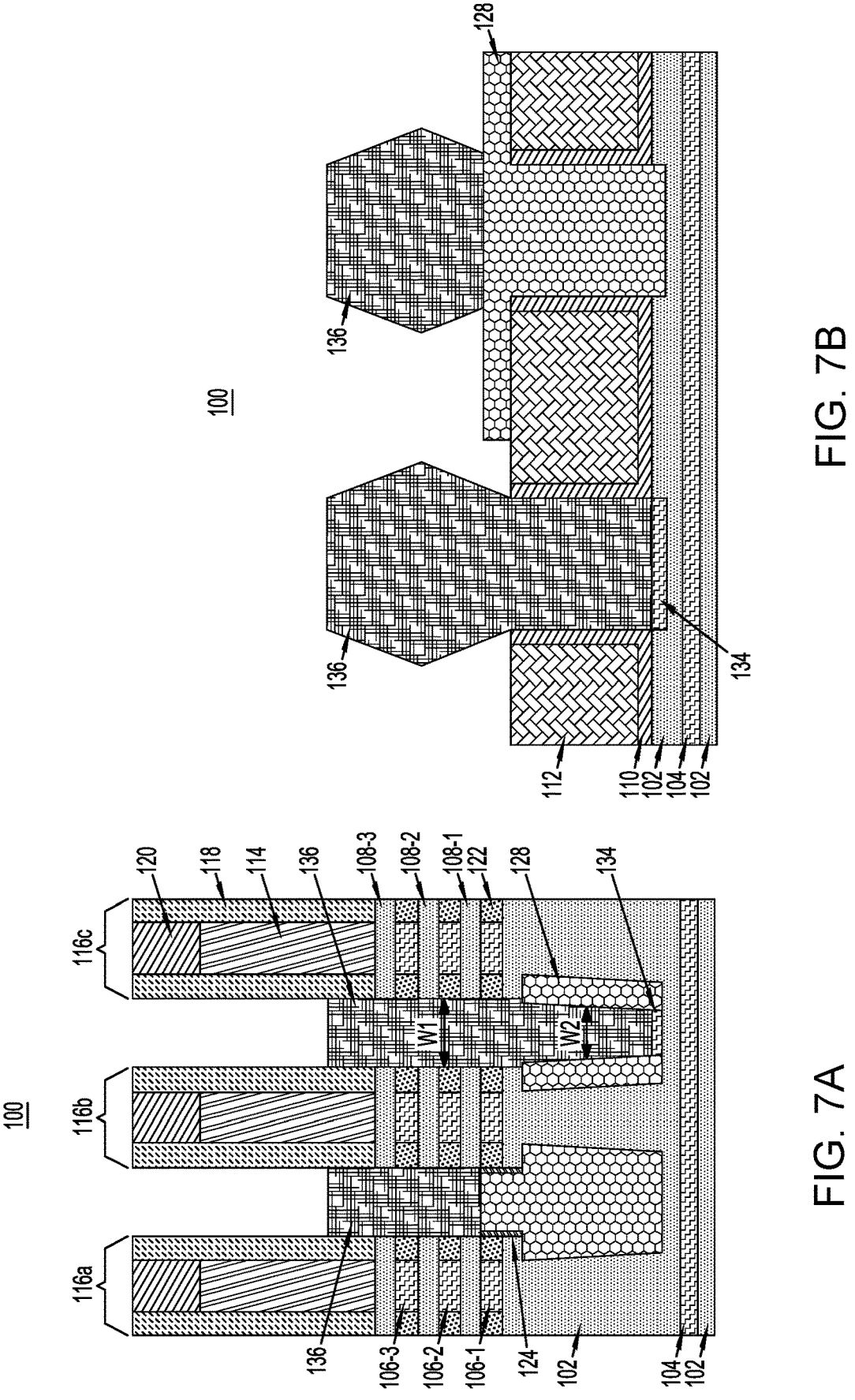
FIG. 7A is a cross-sectional view of the semiconductor structure taken along the X-X axis of FIG. 1A for use at a seventh-intermediate fabrication stage, according to an illustrative embodiment.
FIG. 7B is a cross-sectional view of the semiconductor structure taken along the Y-Y axis of FIG. 1A for use at the seventh-intermediate fabrication stage, according to an illustrative embodiment.

Referring now to FIGS. 7A and 7B, the semiconductor structure 100 is shown following removal of the mask layer 130 and the protective liner layer 124, followed by the formation of backside contact placeholder layers 134, followed by forming source/drain regions 136 in openings 132, according to an embodiment of the invention. The mask layer 130 can be removed using any known technique such as an ash etching process. The protective liner layer 124 can then be removed using any known etching process such as RIE.

The backside contact placeholder layers 134 can be formed using known deposition techniques such as, for example, ALD, PVD, etc. Suitable material for the backside contact placeholder layers 134 may be formed of a sacrificial material such as, for example, SiGe, titanium oxide ($TiO_x$), aluminum oxide ($AlO_x$), silicon carbide (SiC), etc.

The source/drain regions 136 can be formed in the openings 132 and on the spacer layer structure 128. The source/drain regions 136 may be formed using epitaxial growth processes. The terms "epitaxial growth and/or deposition" means the growth of a semiconductor material on a deposition surface of a semiconductor material (e.g., the substrate 102), in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled, and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., PECVD, metal organic chemical vapor deposition (MOCVD). In some embodiments, in which the source/drain regions 136 are composed of an epitaxially formed silicon containing material, the silicon gas source for epitaxial deposition may be selected from the group consisting of Silane ($SiH_4$), disilane ($Si_2H_6$), or higher order silanes, hexachlorodisilane ($Si_2Cl_6$), tetrachlorosilane ($SiCl_4$), dichlorosilane ($Cl_2SiH_2$), trichlorosilane ($Cl_3SiH$), and combinations thereof.

The source/drain regions 136 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) can be doped during deposition (in-situ doped) by adding dopants, such as n-type dopants (e.g., phosphorus or arsenic) or p-type dopants (e.g., boron or gallium), depending on the type of transistor to be formed.

In one or more embodiments, the source/drain regions 136 are of the same crystal structure and orientation as the substrate 102. In one or more embodiments, source/drain regions 136 can have a first region having a first width, and a second region having a second width different than the first width. For example, in one or more non-limiting illustrative embodiments, source/drain regions 136 can have a first region having a width, W1, and a second region having a width, W2, which is less than the width, W1. However, this is merely illustrative and other configurations of source/drain regions 136 are contemplated.

Figures 8A, 8B:
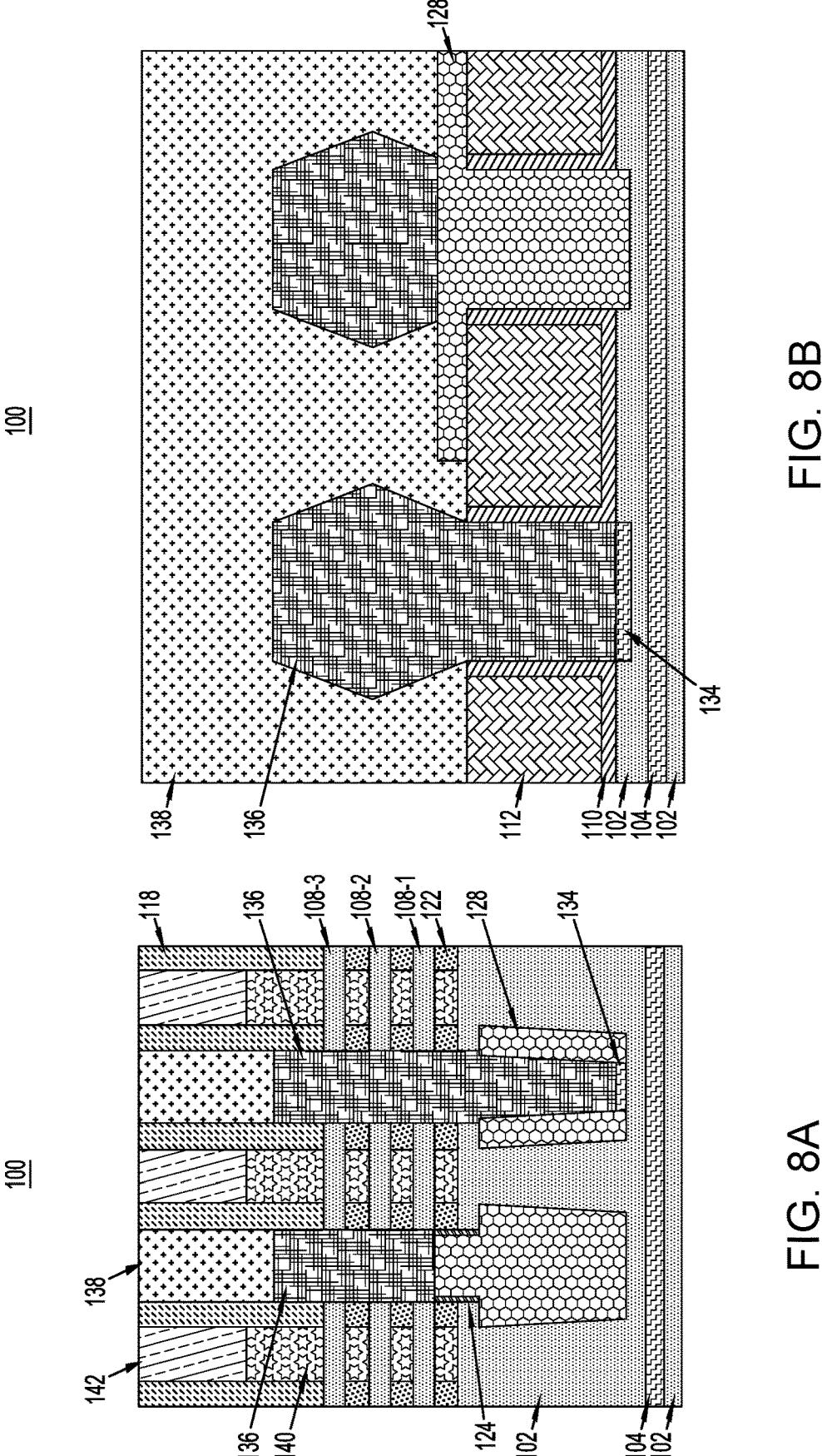
FIG. 8A is a cross-sectional view of the semiconductor structure taken along the X-X axis of FIG. 1A for use at an eighth-intermediate fabrication stage, according to an illustrative embodiment.
FIG. 8B is a cross-sectional view of the semiconductor structure taken along the Y-Y axis of FIG. 1A for use at the eighth-intermediate fabrication stage, according to an illustrative embodiment.

Referring now to FIGS. 8A and 8B, the semiconductor structure 100 is shown following formation of an ILD layer 138, removal of the sacrificial layers 106 and the dummy gate layer 114, followed by the formation of a replacement gate structure 140 with self-aligned cap 142, according to an embodiment of the invention. The ILD layer 138 may be formed of any suitable dielectric material, such as SiO₂, SiOC, SiON, etc. using conventional deposition techniques such as ALD, PVD, CVD, etc. A planarization process such as CMP can then be carried out.

The dummy gate layer 114 is then removed using a selective etching process such as RIE or wet removal processes. Next, known semiconductor fabrication operations are used to remove the sacrificial layers 106 selective to the nanosheet channel layers 108. In some embodiments, because the sacrificial layers 106 are formed from SiGe, they can be selectively etched with respect to the nanosheet channel layers 108 formed from Si using, for example, a vapor phase hydrogen chloride (HCL) gas isotropic etch process.

The removed sacrificial layers 106 and the removed dummy gate layer 114 are replaced with the replacement gate structure 140 using known replacement high-k metal gate (HKMG) processing operations. In some embodiments, the replacement gate structure 140 may comprise a gate dielectric layer and a gate conductor layer. The gate dielectric layer may be formed of a high-k dielectric material. Examples of high-k dielectric materials include, but are not limited to, metal oxides such as HfO₂, hafnium silicon oxide (Hf—Si—O), hafnium silicon oxynitride (HfSiON), lanthanum oxide (La₂O₃), lanthanum aluminum oxide (LaAlO₃), zirconium oxide (ZrO₂), zirconium silicon oxide, zirconium silicon oxynitride, tantalum oxide (Ta₂O₅), titanium oxide (TiO₂), barium strontium titanium oxide, barium titanium oxide, strontium titanium oxide, yttrium oxide (Y₂O₃), aluminum oxide (Al₂O₃), lead scandium tantalum oxide, and lead zinc niobate. The high-k material may further include dopants such as lanthanum (La), aluminum (Al), and magnesium (Mg).

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The self-aligned cap 142 may be composed of a dielectric material such as, for example, a dielectric nitride, dielectric oxide, and/or dielectric oxynitride. More specifically, self-aligned cap 142 may be, for example, silicon oxide, SiN, SiBCN, SiBN, SiOCN, SION, SiCO, or SiC. In one example, the self-aligned cap 142 is composed of a non-conductive low capacitance dielectric material such as SiOC. The dielectric material that provides the self-aligned cap 142 may be provided by a deposition process including, for example, CVD, PECVD, or PVD. A planarization process or an etch back process can follow the deposition of the dielectric material that provides the self-aligned cap 142.

Figures 9A, 9B:
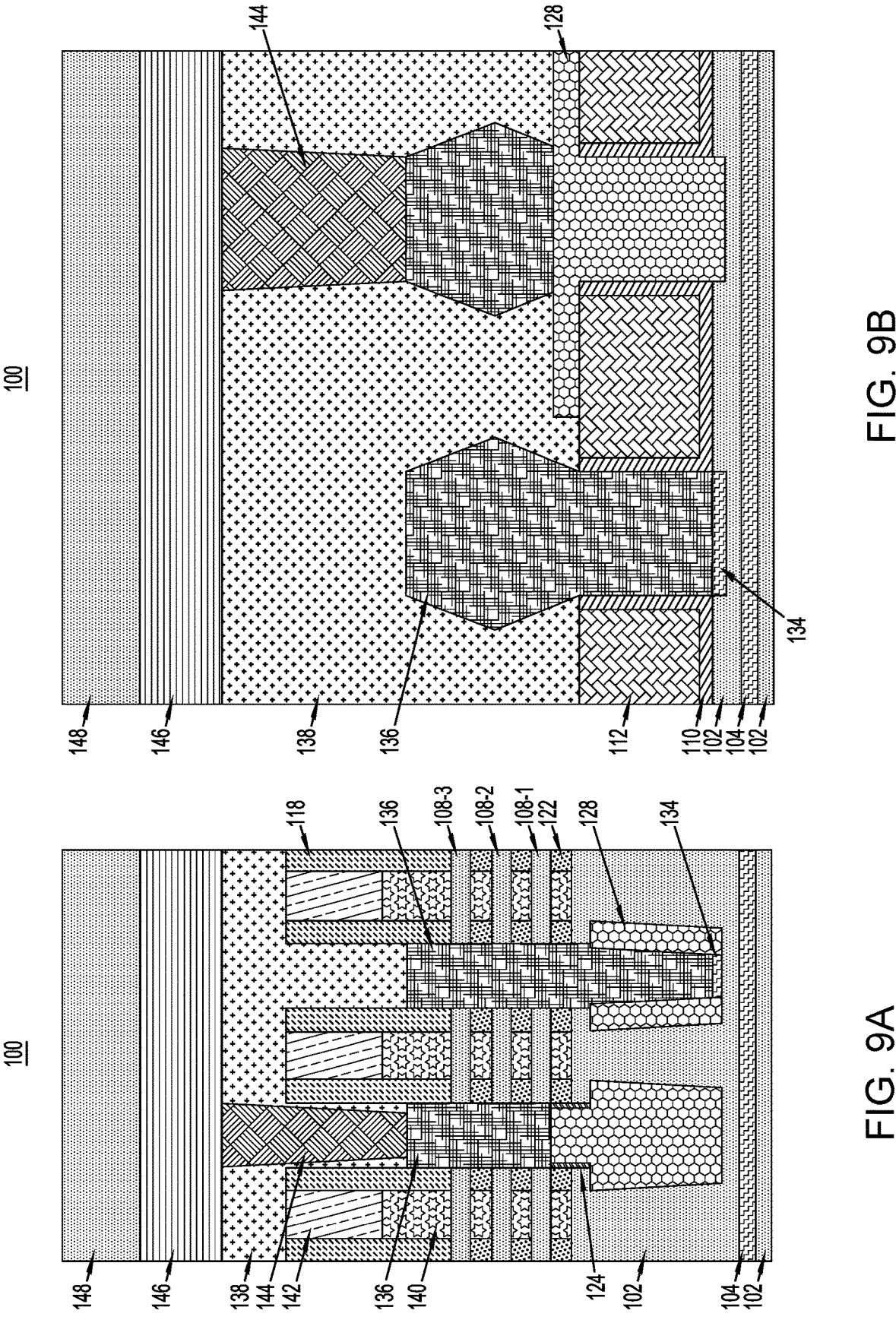
FIG. 9A is a cross-sectional view of the semiconductor structure taken along the X-X axis of FIG. 1A for use at a ninth-intermediate fabrication stage, according to an illustrative embodiment.
FIG. 9B is a cross-sectional view of the semiconductor structure taken along the Y-Y axis of FIG. 1A for use at the ninth-intermediate fabrication stage, according to an illustrative embodiment.

Referring now to FIGS. 9A and 9B the semiconductor structure 100 is shown following the formation of middle-of-the-line contacts 144, a frontside back-end-of-line (BEOL) interconnect 146 and a carrier wafer 148 according to an embodiment of the invention. The middle-of-the-line contacts 144, which can also be referred to as source/drain contacts 144, can be formed by any conventional technique. In some embodiments, the middle-of-the-line contacts 144 can be formed by depositing an additional amount of the ILD layer 138 and utilizing conventional lithographic and selective etch processes such as a wet or dry etch etching process in the ILD layer 138 to form an opening. For example, a dry etching process may implement an oxygen-containing gas, a fluorine-containing gas (e.g., CF₄, SF₆, CH₂F₂, CHF₃, and/or C₂F₆), a chlorine-containing gas (e.g., Cl₂, CHCl₃, CCl₄, and/or BCl₃), a bromine-containing gas (e.g., HBr and/or CHBr₃), an iodine-containing gas, other suitable gases and/or plasmas, and/or combinations thereof. As another example, a wet etching process may comprise etching in DHF, potassium hydroxide (KOH) solution, ammonia, a solution containing hydrofluoric acid (HF), nitric acid (HNO₃), and/or acetic acid (CH₃COOH), or other suitable wet etchants.

Next, a high conductive metal is deposited in the openings to form the middle-of-the-line contacts 144. Suitable high conductive metals include, for example, conductive material such as, for example, tungsten (W), aluminum (Al), copper (Cu), cobalt (Co), ruthenium (Ru), molybdenum (Mo), or any other suitable conductive material with or without different thin film material deposited first. In various embodiments, the high conductive metal can be deposited by ALD, CVD, PVD, and/or plating. The high conductive metal can be planarized using, for example, a planarizing process such as CMP. Other planarization processes can include grinding and polishing.

The frontside BEOL interconnect 146 is then formed followed by bonding of the structure (e.g., the frontside BEOL interconnect 146) to the carrier wafer 148. The frontside BEOL interconnect 146 includes various BEOL interconnect structures. For example, the frontside BEOL interconnect 146 is a metallization structure that includes one or more metal layers disposed on a side of the semiconductor structure 100 opposite of the side on which the backside BEOL metallization structure is disposed. The metal layers of the frontside BEOL interconnect 146 each have metal lines for making interconnections to the semiconductor device.

The carrier wafer 148 may be formed of materials similar to that of the substrate 102, and may be formed over the frontside BEOL interconnect 146 using a wafer bonding process, such as dielectric-to-dielectric bonding.

Figures 10A, 10B:
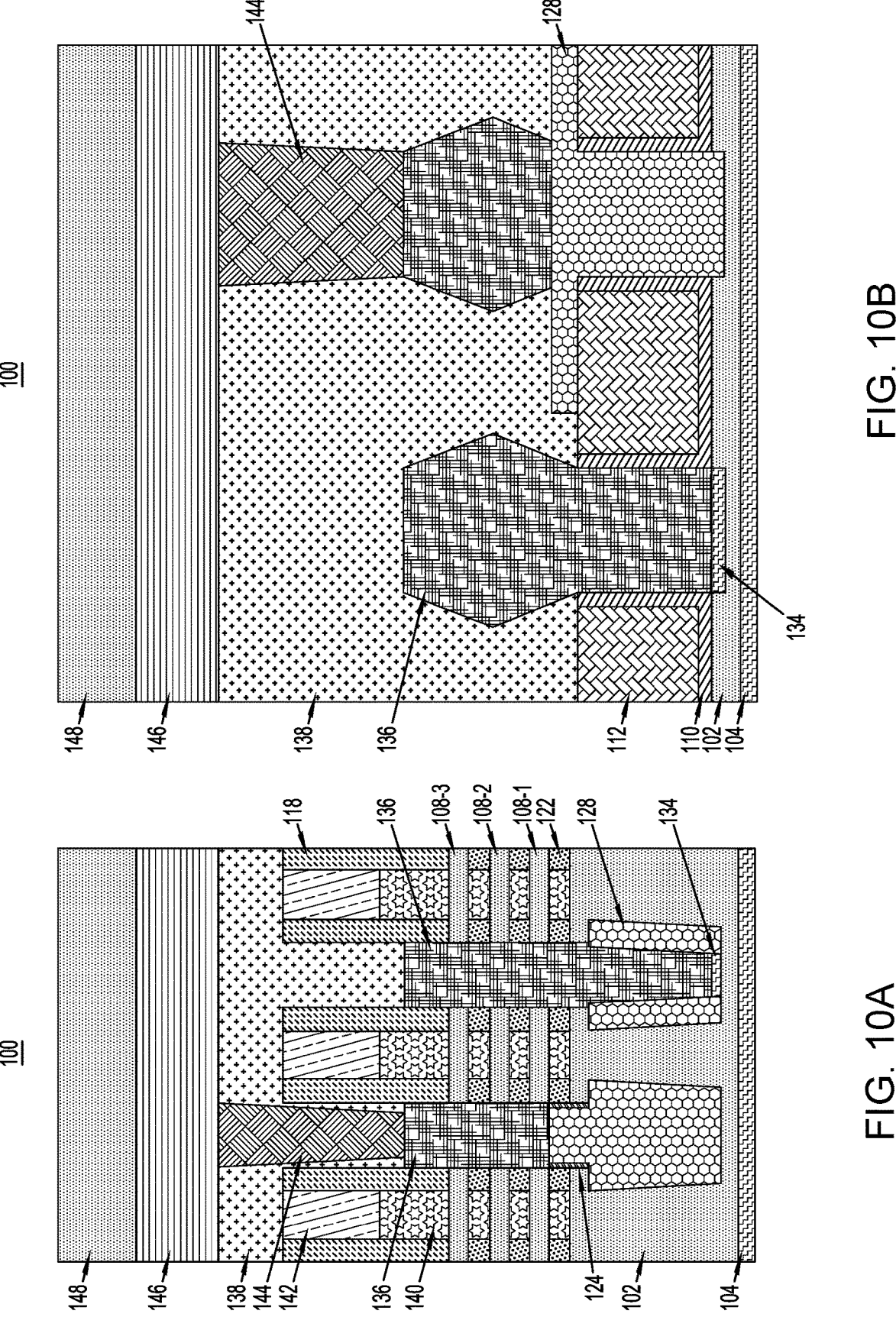
FIG. 10A is a cross-sectional view of the semiconductor structure taken along the X-X axis of FIG. 1A for use at a tenth-intermediate fabrication stage, according to an illustrative embodiment.
FIG. 10B is a cross-sectional view of the semiconductor structure taken along the Y-Y axis of FIG. 1A for use at the tenth-intermediate fabrication stage, according to an illustrative embodiment.

Referring now to FIGS. 10A and 10B, the semiconductor structure 100 is shown following backside processing of the substrate 102 according to an embodiment of the invention. The backside processing can be carried out by, for example, flipping the semiconductor structure 100 over so that the backside of the substrate 102 (i.e., the back surface) is facing up. First, portions of the substrate 102 may be removed from the backside using, for example, a combination of wafer grinding, CMP, dry etch and/or wet etch to selectively remove the substrate 102 until the etch stop layer 104 is reached.

Figures 11A, 11B:
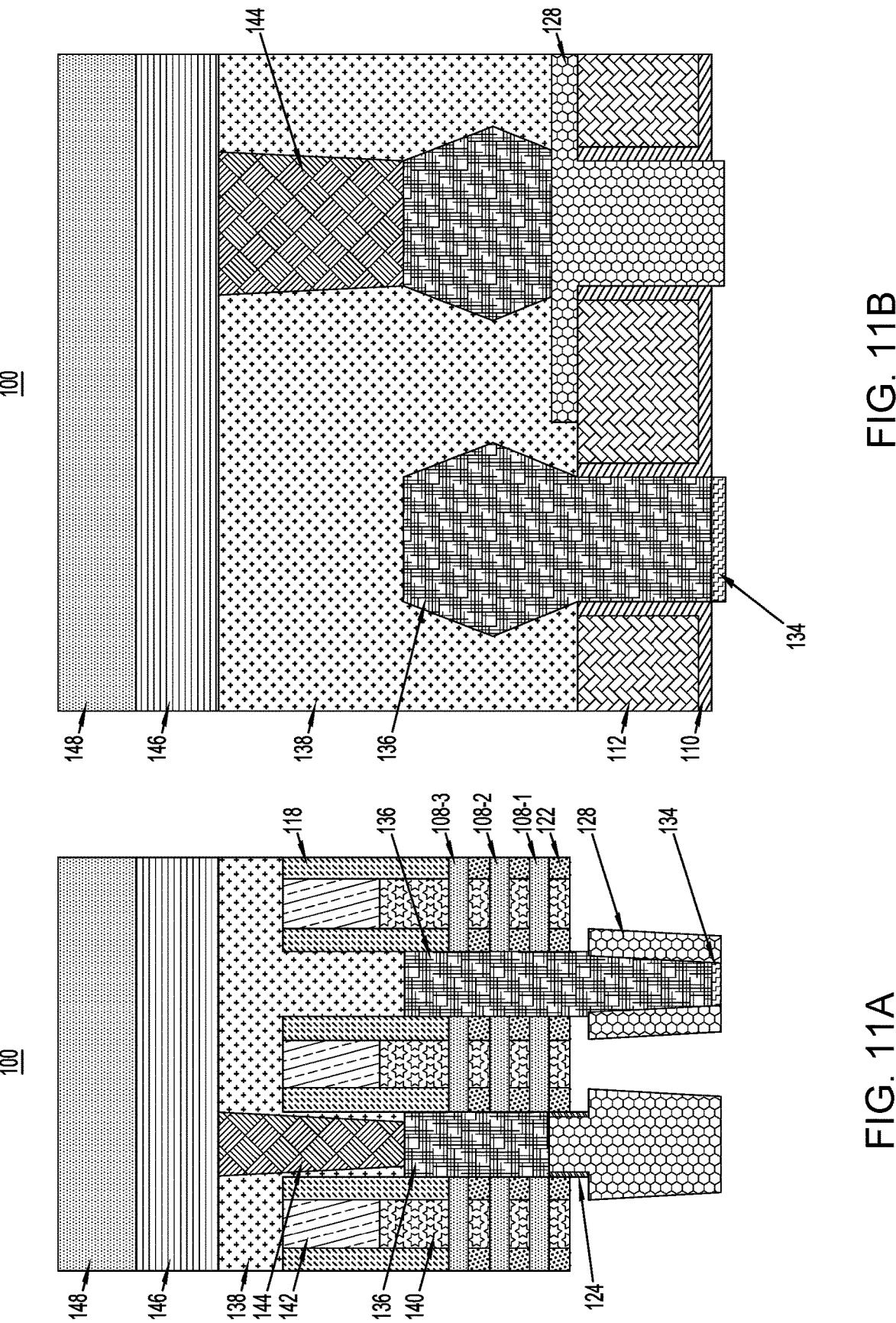
FIG. 11A is a cross-sectional view of the semiconductor structure taken along the X-X axis of FIG. 1A for use at an eleventh-intermediate fabrication stage, according to an illustrative embodiment.
FIG. 11B is a cross-sectional view of the semiconductor structure taken along the Y-Y axis of FIG. 1A for use at the eleventh-intermediate fabrication stage, according to an illustrative embodiment.

Referring now to FIGS. 11A and 11B, the semiconductor structure 100 is shown following removal of the etch stop layer 104 and the substrate 102 according to an embodiment of the invention. The etch stop layer 104 is selectively removed using, for example, a wet etch to selectively remove the etch stop layer 104 until the substrate 102 is reached. The remaining portions of the substrate 102 are removed utilizing a selective etch process such as a wet etch. As one skilled in the art will readily appreciate, the step of removing remaining portions of the substrate 102 is merely illustrative and it is also contemplated to remove only a selected portion of the substrate 102 such that a portion of the substrate remains on the semiconductor structure 100 (see, for example, FIGS. 16A-18B).

Figures 12A, 12B:
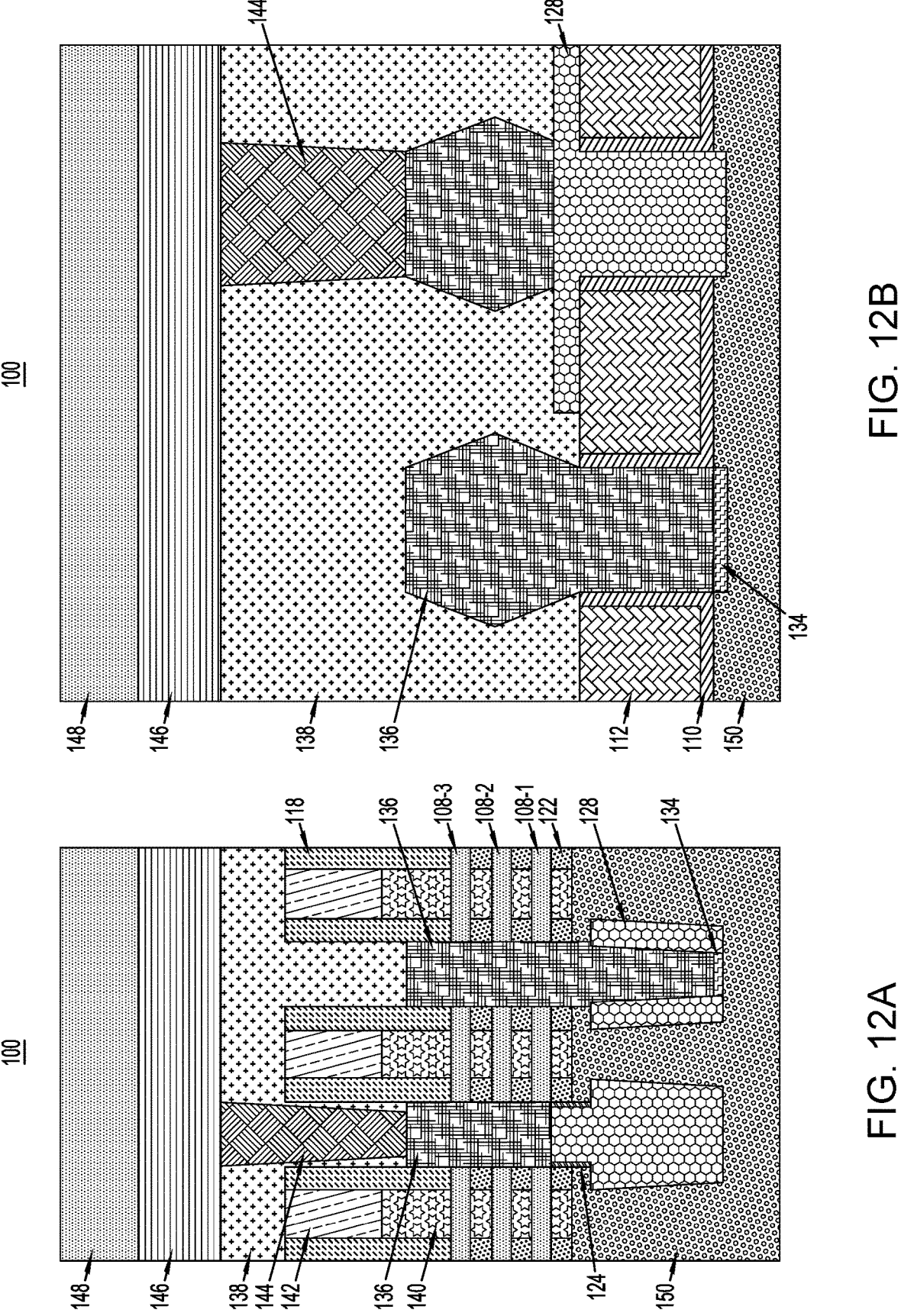
FIG. 12A is a cross-sectional view of the semiconductor structure taken along the X-X axis of FIG. 1A for use at a twelfth-intermediate fabrication stage, according to an illustrative embodiment.
FIG. 12B is a cross-sectional view of the semiconductor structure taken along the Y-Y axis of FIG. 1A for use at the twelfth-intermediate fabrication stage, according to an illustrative embodiment.

Referring now to FIGS. 12A and 12B, the semiconductor structure 100 is shown following the deposition of a back-side ILD layer 150 according to an embodiment of the invention. The backside ILD layer 150 may be formed of similar processes and material as the ILD layer 138. Following formation of the backside ILD layer 150, any overfill can be removed by a planarization process such as CMP.

Figures 13A, 13B:
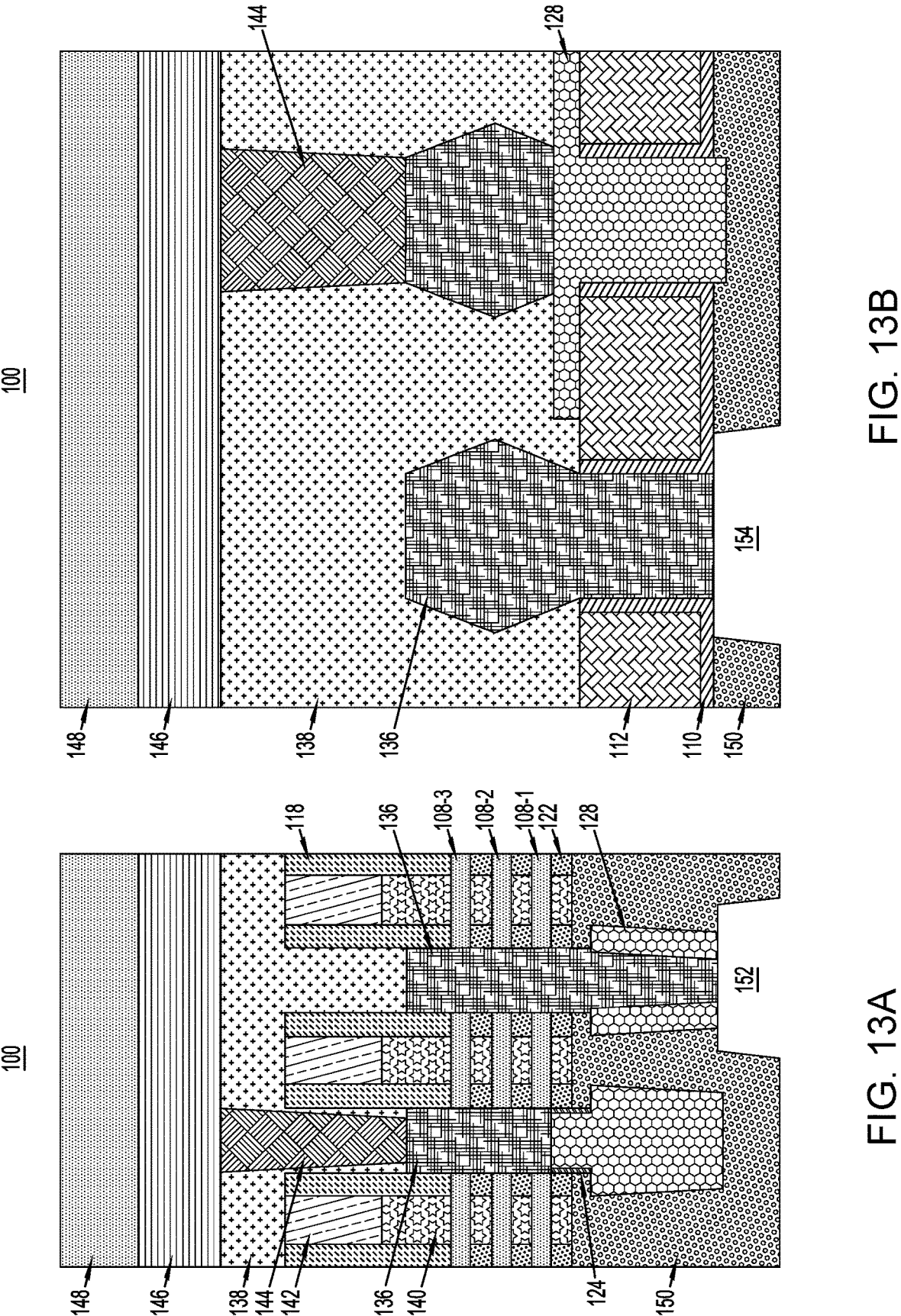
FIG. 13A is a cross-sectional view of the semiconductor structure taken along the X-X axis of FIG. 1A for use at a thirteenth-intermediate fabrication stage, according to an illustrative embodiment.
FIG. 13B is a cross-sectional view of the semiconductor structure taken along the Y-Y axis of FIG. 1A for use at the thirteenth-intermediate fabrication stage, according to an illustrative embodiment.

Referring now to FIGS. 13A and 13B, the semiconductor structure 100 is shown following the formation of backside middle-of-the-line contact openings 152 and 154 according to an embodiment of the invention. In some embodiments, the backside middle-of-the-line contact openings 152 and 154 can be formed by first patterning and etching lines in the backside ILD layer 150 and removing a given one of the backside contact placeholder layers 134 to expose one of the source/drain regions 136 and the spacer layer structure 128 (see FIG. 13A) and one of the source/drain regions 136 and the STI liner layer 110 (see FIG. 13B) using any suitable wet or dry etch.

Figures 14A, 14B:
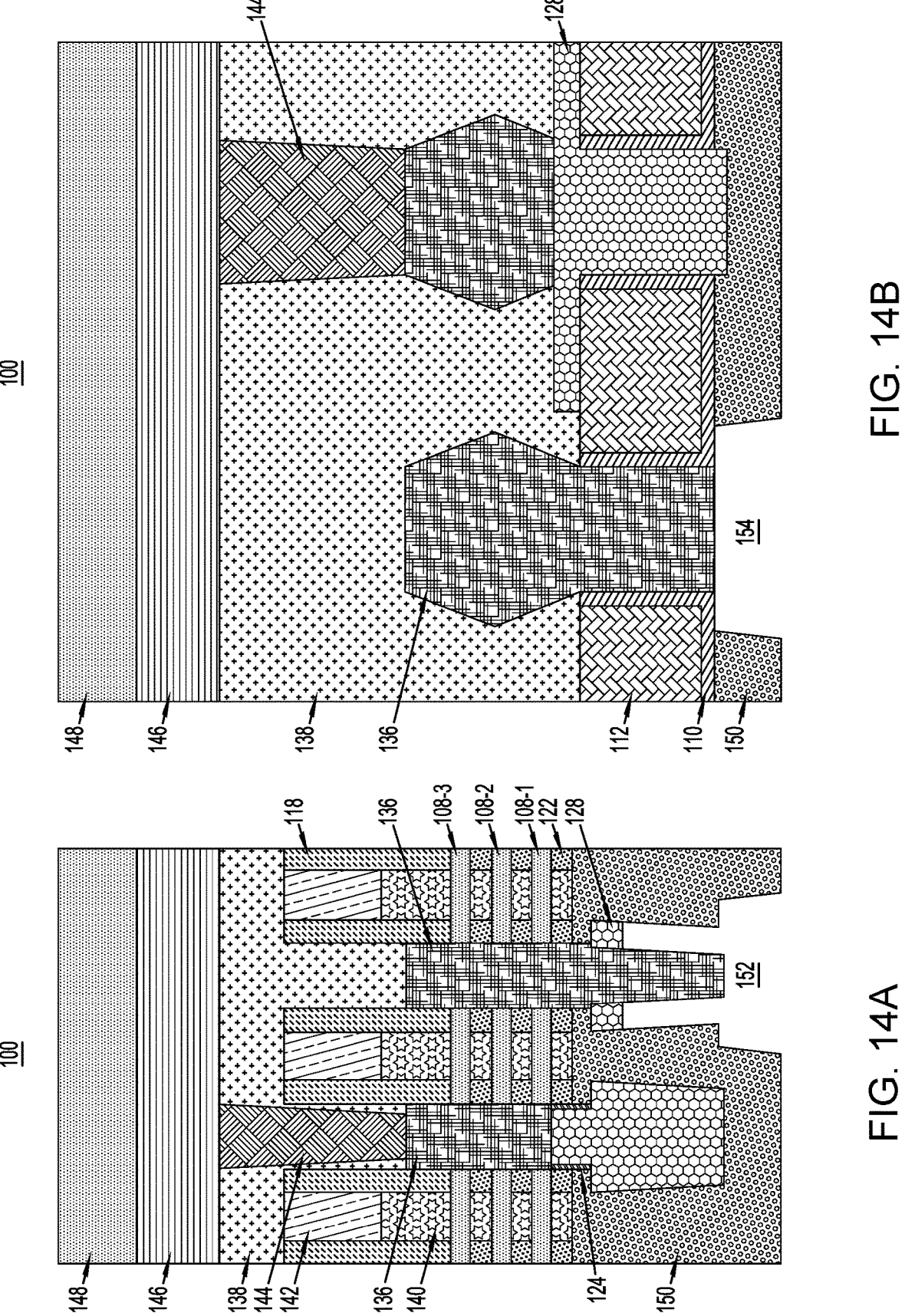
FIG. 14A is a cross-sectional view of the semiconductor structure taken along the X-X axis of FIG. 1A for use at a fourteenth-intermediate fabrication stage, according to an illustrative embodiment.
FIG. 14B is a cross-sectional view of the semiconductor structure taken along the Y-Y axis of FIG. 1A for use at the fourteenth-intermediate fabrication stage, according to an illustrative embodiment.

Referring now to FIGS. 14A and 14B, the semiconductor structure 100 is shown following removal of a portion of the spacer layer structure 128 according to an embodiment of the invention. A portion of the spacer layer structure 128 is selectively removed in the backside middle-of-the-line con-tact opening 152 using a selective etching process such as RIE.

Figures 15A, 15B:
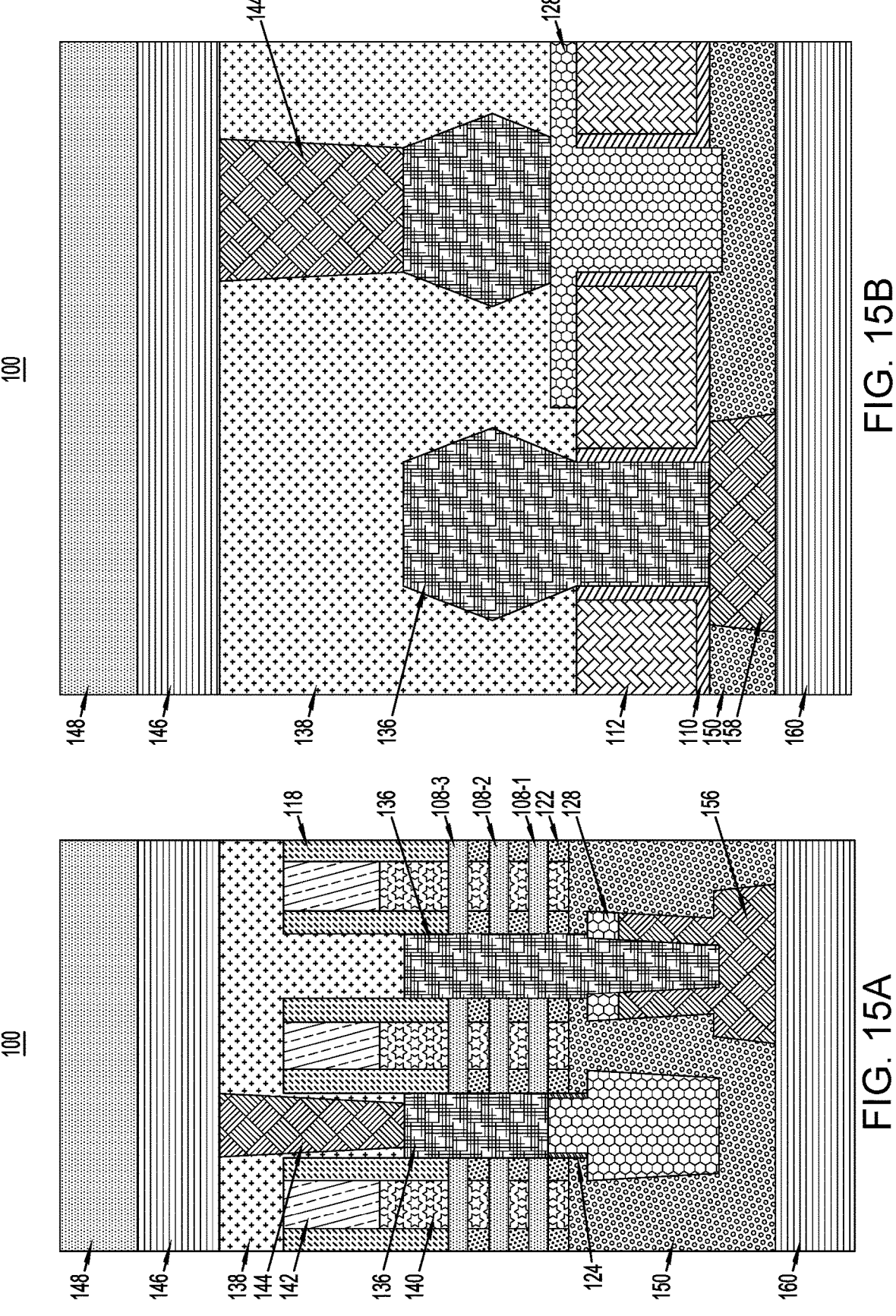
FIG. 15A is a cross-sectional view of the semiconductor structure taken along the X-X axis of FIG. 1A for use at a fifteenth-intermediate fabrication stage, according to an illustrative embodiment.
FIG. 15B is a cross-sectional view of the semiconductor structure taken along the Y-Y axis of FIG. 1A for use at the fifteenth-intermediate fabrication stage, according to an illustrative embodiment.

Referring now to FIGS. 15A and 15B, the semiconductor structure 100 is shown following the formation of backside middle-of-the-line contacts 156 and 158 (also referred to as backside source/drain contacts 156 and 158) according to an embodiment of the invention. A suitable conductive metal is deposited in the backside middle-of-the-line contact opening 152 (as shown in FIG. 15A) to form the backside middle-of-the-line contact 156, which can be referred to as a backside wrap-around middle-of-the-line contact 156, and in the backside middle-of-the-line contact opening 154 (as shown in FIG. 15B) to form the backside middle-of-the-line contact 158, followed by CMP to remove any metal on top of the backside ILD layer 150. A suitable conductive metal can be deposited in a similar manner and of similar con-ductive metal as discussed above.

Next, a backside power delivery network 160 is formed over the semiconductor structure 100 including the backside middle-of-the-line contacts 156 and 158 and is based on creation of a wiring scheme that is disposed on both sides of the device layer (front end of line structure).

Figures 16A, 16B:
FIG. 16A is a cross-sectional view of the semiconductor structure taken along the X-X axis of FIG. 1A starting from FIGS. 9A and 9B without an etch stop layer in the substrate for use at an intermediate fabrication stage, according to an illustrative alternative embodiment.
FIG. 16B is a cross-sectional view of the semiconductor structure taken along the Y-Y axis of FIG. 1A for use at the intermediate fabrication stage, according to an illustrative alternative embodiment.

FIGS. 16A-17B illustrate an alternative embodiment for forming semiconductor structure 100 starting from FIGS. 9A and 9B. FIGS. 16A and 16B show the semiconductor structure 100 having the substrate 102 without the etch stop layer 104 being disposed therein. according to an illustrative embodiment. FIG. 16A further show the semiconductor structure 100 having another source/drain region of the source/drain regions 136 extending into the substrate 102 having spacer layer structure 128 disposed on a portion of its sidewalls and backside contact placeholder layers 134 dis-posed on a bottom surface of the given source/drain region of the source/drain regions 136 extending into the substrate 102.

Figures 17A, 17B:
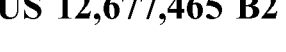
FIG. 17A is a cross-sectional view of the semiconductor structure taken along the X-X axis of FIG. 1A for use at a second intermediate fabrication stage, according to an illustrative alternative embodiment.
FIG. 17B is a cross-sectional view of the semiconductor structure taken along the Y-Y axis of FIG. 1A for use at the second intermediate fabrication stage, according to an illustrative alternative embodiment.

Referring now to FIGS. 17A and 17B, the semiconductor structure 100 is shown following backside processing of the substrate 102 according to an embodiment of the invention. The backside processing can be carried out by, for example, flipping the semiconductor structure 100 over so that the backside of the substrate 102 (i.e., the back surface) is facing up. First, portions of the substrate 102 may be removed from the backside using, for example, a combination of wafer grinding, CMP, dry etch and/or wet etch to selectively remove the substrate 102 until a portion of the spacer layer structure 128 is exposed.

Next, a backside ILD layer 162 is deposited on the substrate 102 and on the spacer layer structure 128 and the source/drain regions 136 (see FIG. 17A) according to an embodiment of the invention. The backside ILD layer 162 may be formed of similar processes and material as the ILD layer 138. Following formation of the backside ILD layer 162, any overfill can be removed by a planarization process such as CMP.

A backside middle-of-the-line contact opening (not shown) is formed by first patterning and etching lines in the backside ILD layer 162 to remove one of the backside contact placeholder layers 134 and expose a bottom surface of a given one of the source/drain regions 136 and the spacer layer structure 128 using any suitable wet or dry etch. The exposed spacer layer structure 128 is then selectively removed in the backside middle-of-the-line contact opening using a selective etching process such as RIE.

A backside middle-of-the-line contact 164 (also referred to as backside source/drain contact 164) is formed by depositing a suitable conductive metal is deposited in the backside middle-of-the-line contact opening. The backside middle-of-the-line contact 164 can also be referred to as a backside wrap-around middle-of-the-line contact 164. A suitable conductive metal can be deposited in a similar manner and of similar conductive metal as discussed above.

Figures 18A, 18B:
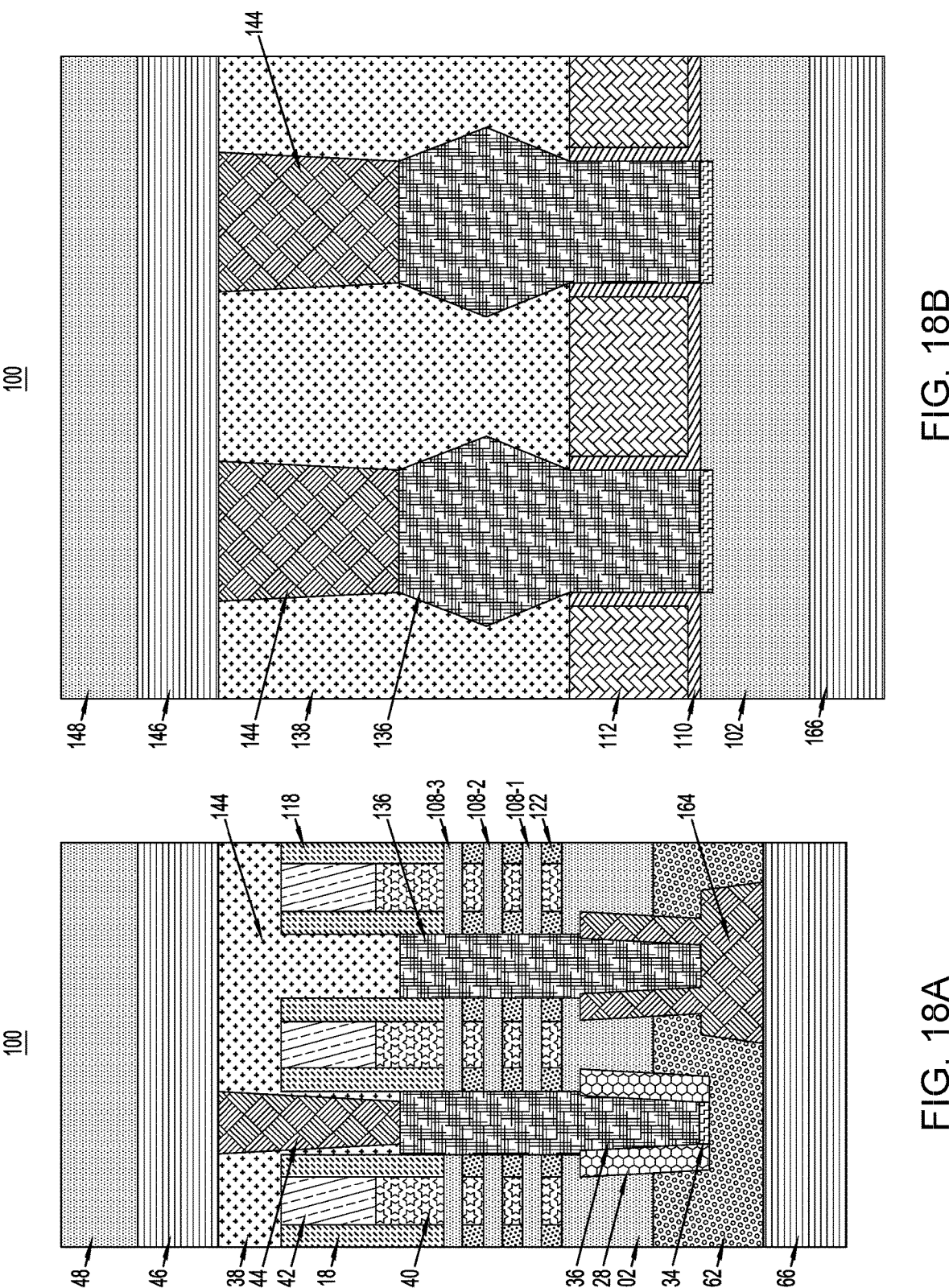
FIG. 18A is a cross-sectional view of the semiconductor structure taken along the X-X axis of FIG. 1A for use at a third intermediate fabrication stage, according to an illustrative alternative embodiment.
FIG. 18B is a cross-sectional view of the semiconductor structure taken along the Y-Y axis of FIG. 1A for use at the third intermediate fabrication stage, according to an illustrative alternative embodiment.

Referring now to FIGS. 18A and 18B, the semiconductor structure 100 is shown following the formation of a backside power delivery network 166 according to an embodiment of the invention. The backside power delivery network 166 is formed over the semiconductor structure 100 including the backside middle-of-the-line contact 164 and is based on creation of a wiring scheme that is disposed on both sides of the device layer (front end of line structure).

According to an aspect of the disclosure, a semiconductor structure comprises a first nanosheet field-effect transistor device comprising a plurality of first nanosheet channel layers disposed on a substrate, a second nanosheet field-effect transistor device adjacent the first field-effect transistor nanosheet device, the second field-effect transistor nanosheet device comprising a plurality of second nanosheet channel layers disposed on the substrate, a first source/drain region disposed between opposing sidewalls of the plurality of first nanosheet channel layers and the plurality of second nanosheet channel layers and extending into the substrate, and source/drain sidewall spacers disposed on sidewalls of the first source/drain region extending into the substrate.

In embodiments, the substrate comprises a bulk silicon substrate.

In embodiments, the bulk silicon substrate comprises a first crystalline structure and the first source/drain region comprises a second crystalline structure matching the first crystalline structure.

In embodiments, the first source/drain region is an epitaxial grown first source/drain region.

In embodiments, the first source/drain region disposed between the opposing sidewalls of the plurality of first nanosheet channel layers and the plurality of second nanosheet channel layers comprises a first width and the first source/drain region extending into the substrate comprises a second width different than the first width.

In embodiments, the semiconductor structure further comprises a backside contact placeholder layer disposed between a bottom surface of the first source/drain region and a top surface of the substrate.

In embodiments, the semiconductor structure further comprises a frontside source/drain contact connecting the first source/drain region to a frontside back-end-of-the-line interconnect.

In embodiments, the semiconductor structure further comprises a third nanosheet field-effect transistor device adjacent the second field-effect transistor nanosheet device, the third field-effect transistor nanosheet device comprising a plurality of third nanosheet channel layers disposed on the substrate, a second source/drain region disposed between opposing sidewalls of the plurality of second nanosheet channel layers and the plurality of third nanosheet channel layers and extending into the substrate and a backside interlevel dielectric layer, and a backside contact disposed on a portion of sidewalls and a bottom surface of the second source/drain region extending into the backside interlevel dielectric layer.

In embodiments, the second source/drain region disposed between the opposing sidewalls of the plurality of second nanosheet channel layers and the plurality of third nanosheet channel layers comprises a first width and the second source/drain region extending into the substrate and the backside interlevel dielectric layer comprises a second width different than the first width.

According to an aspect of the disclosure, a semiconductor structure comprises a first nanosheet field-effect transistor device comprising a plurality of first nanosheet channel layers disposed on a backside interlevel dielectric layer, a second nanosheet field-effect transistor device adjacent the first field-effect transistor nanosheet device, the second field-effect transistor nanosheet device comprising a plurality of second nanosheet channel layers disposed on the backside interlevel dielectric layer, a first source/drain region disposed between opposing sidewalls of the plurality of first nanosheet channel layers and the plurality of second nanosheet channel layers and extending into the backside interlevel dielectric layer, first source/drain sidewall spacers disposed on a portion of sidewalls of the first source/drain region extending into the backside interlevel dielectric layer, and a backside contact disposed on remaining portions of the sidewalls and a bottom surface of the first source/drain region extending into the backside interlevel dielectric layer.

In embodiments, the semiconductor structure further comprises the backside contact connects the first source/drain region to a backside interconnect.

In embodiments, the semiconductor structure further comprises the first source/drain region disposed between the opposing sidewalls of the plurality of first nanosheet channel layers and the plurality of second nanosheet channel layers comprises a first width and the first source/drain region extending into the backside interlevel dielectric layer comprises a second width different than the first width.

In embodiments, the semiconductor structure further comprises a third nanosheet field-effect transistor device adjacent the second field-effect transistor nanosheet device, the third field-effect transistor nanosheet device comprising a plurality of third nanosheet channel layers disposed on the backside interlevel dielectric layer, and a second source/drain region disposed between opposing sidewalls of the plurality of second nanosheet channel layers and the plurality of third nanosheet channel layers.

In embodiments, the semiconductor structure further comprises a frontside source/drain contact connecting the second source/drain region to a frontside back-end-of-the-line interconnect.

In embodiments, the semiconductor structure further comprises the second source/drain region is further disposed on a flowable dielectric layer.

In embodiments, the first source/drain region further extends into a substrate disposed between the backside interlevel dielectric layer and the plurality of first nanosheet channel layers and the plurality of second nanosheet channel layers.

According to an aspect of the disclosure, an integrated circuit comprises one or more semiconductor structures, wherein at least one of the one or more semiconductor structures comprises a first nanosheet field-effect transistor device comprising a plurality of first nanosheet channel layers disposed on a substrate, a second nanosheet field-effect transistor device adjacent the first field-effect transistor nanosheet device, the second field-effect transistor nanosheet device comprising a plurality of second nanosheet channel layers disposed on the substrate, a first source/drain region disposed between opposing sidewalls of the plurality of first nanosheet channel layers and the plurality of second nanosheet channel layers and extending into the substrate, and source/drain sidewall spacers disposed on sidewalls of the first source/drain region extending into the substrate.

In embodiments, the substrate comprises a bulk silicon substrate comprising a first crystalline structure and the first source/drain region comprises a second crystalline structure matching the first crystalline structure.

In embodiments, the first source/drain region disposed between the opposing sidewalls of the plurality of first nanosheet channel layers and the plurality of second nanosheet channel layers comprises a first width and the first source/drain region extending into the substrate comprises a second width different than the first width.

In embodiments, the integrated circuit further comprises a third nanosheet field-effect transistor device adjacent the second field-effect transistor nanosheet device, the third field-effect transistor nanosheet device comprising a plurality of third nanosheet channel layers disposed on the substrate, a second source/drain region disposed between opposing sidewalls of the plurality of second nanosheet channel layers and the plurality of third nanosheet channel layers and extending into the substrate and a backside interlevel dielectric layer, and a backside contact disposed on a portion of sidewalls and a bottom surface of the second source/drain region extending into the backside interlevel dielectric layer.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOS-FETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first nanosheet field-effect transistor device comprising a plurality of first nanosheet channel layers disposed on a substrate;
a second nanosheet field-effect transistor device adjacent the first field-effect transistor nanosheet device, the second field-effect transistor nanosheet device comprising a plurality of second nanosheet channel layers disposed on the substrate;
a first source/drain region disposed between opposing sidewalls of the plurality of first nanosheet channel layers and the plurality of second nanosheet channel layers and extending into the substrate; and
source/drain sidewall spacers disposed on sidewalls of the first source/drain region extending into the substrate and an interlevel dielectric layer.

2. The semiconductor structure according to claim 1, wherein the substrate comprises a bulk silicon substrate.

3. The semiconductor structure according to claim 2, wherein the bulk silicon substrate comprises a first crystalline structure and the first source/drain region comprises a second crystalline structure matching the first crystalline structure.

4. The semiconductor structure according to claim 1, wherein the first source/drain region is an epitaxial grown first source/drain region.

5. The semiconductor structure according to claim 1, wherein the first source/drain region disposed between the opposing sidewalls of the plurality of first nanosheet channel layers and the plurality of second nanosheet channel layers comprises a first width and the first source/drain region extending into the substrate comprises a second width different than the first width.

6. The semiconductor structure according to claim 1, further comprising a backside contact placeholder layer disposed between a bottom surface of the first source/drain region and a top surface of the substrate.

7. The semiconductor structure according to claim 1, further comprising:
a frontside source/drain contact connecting the first source/drain region to a frontside back-end-of-the-line interconnect.

8. The semiconductor structure according to claim 1, further comprising:
a third nanosheet field-effect transistor device adjacent the second field-effect transistor nanosheet device, the third field-effect transistor nanosheet device comprising a plurality of third nanosheet channel layers disposed on the substrate;
a second source/drain region disposed between opposing sidewalls of the plurality of second nanosheet channel layers and the plurality of third nanosheet channel layers and extending into the substrate and a backside interlevel dielectric layer; and
a backside contact disposed on a portion of sidewalls and a bottom surface of the second source/drain region extending into the backside interlevel dielectric layer.

9. The semiconductor structure according to claim 8, wherein the second source/drain region disposed between the opposing sidewalls of the plurality of second nanosheet channel layers and the plurality of third nanosheet channel layers comprises a first width and the second source/drain region extending into the substrate and the backside interlevel dielectric layer comprises a second width different than the first width.

10. A semiconductor structure, comprising:
a first nanosheet field-effect transistor device comprising a plurality of first nanosheet channel layers disposed on a backside interlevel dielectric layer;
a second nanosheet field-effect transistor device adjacent the first field-effect transistor nanosheet device, the second field-effect transistor nanosheet device comprising a plurality of second nanosheet channel layers disposed on the backside interlevel dielectric layer;
a first source/drain region disposed between opposing sidewalls of the plurality of first nanosheet channel layers and the plurality of second nanosheet channel layers and extending into the backside interlevel dielectric layer;
source/drain sidewall spacers disposed on a portion of sidewalls of the first source/drain region extending into the backside interlevel dielectric layer, wherein the source/drain sidewall spacers are separated from the second nanosheet field-effect transistor device by the backside interlevel dielectric layer; and
a backside contact disposed on remaining portions of the sidewalls below the source/drain sidewall spacers and a bottom surface of the first source/drain region extending into the backside interlevel dielectric layer.

11. The semiconductor structure according to claim 10, wherein the backside contact connects the first source/drain region to a backside interconnect.

12. The semiconductor structure according to claim 10, wherein the first source/drain region disposed between the opposing sidewalls of the plurality of first nanosheet channel layers and the plurality of second nanosheet channel layers comprises a first width and the first source/drain region extending into the backside interlevel dielectric layer comprises a second width different than the first width.

13. The semiconductor structure according to claim 10, further comprising:

a third nanosheet field-effect transistor device adjacent the second field-effect transistor nanosheet device, the third field-effect transistor nanosheet device comprising a plurality of third nanosheet channel layers disposed on the backside interlevel dielectric layer; and a second source/drain region disposed between opposing sidewalls of the plurality of second nanosheet channel layers and the plurality of third nanosheet channel layers.

14. The semiconductor structure according to claim 13, further comprising:

a frontside source/drain contact connecting the second source/drain region to a frontside back-end-of-the-line interconnect.

15. The semiconductor structure according to claim 13, wherein the second source/drain region is further disposed on a flowable dielectric layer.

16. The semiconductor structure according to claim 10, wherein the first source/drain region further extends into a substrate disposed between the backside interlevel dielectric layer and the plurality of first nanosheet channel layers and the plurality of second nanosheet channel layers.

17. An integrated circuit, comprising:

one or more semiconductor structures, wherein at least one of the one or more semiconductor structures comprises:

a first nanosheet field-effect transistor device comprising a plurality of first nanosheet channel layers disposed on a substrate;

a second nanosheet field-effect transistor device adjacent the first field-effect transistor nanosheet device, the second field-effect transistor nanosheet device comprising a plurality of second nanosheet channel layers disposed on the substrate;

a first source/drain region disposed between opposing sidewalls of the plurality of first nanosheet channel layers and the plurality of second nanosheet channel layers and extending into the substrate; and source/drain sidewall spacers disposed on sidewalls of the first source/drain region extending into the substrate and an interlevel dielectric layer.

18. The integrated circuit according to claim 17, wherein the substrate comprises a bulk silicon substrate comprising a first crystalline structure and the first source/drain region comprises a second crystalline structure matching the first crystalline structure.

19. The integrated circuit according to claim 17, wherein the first source/drain region disposed between the opposing sidewalls of the plurality of first nanosheet channel layers and the plurality of second nanosheet channel layers comprises a first width and the first source/drain region extending into the substrate comprises a second width different than the first width.

20. The integrated circuit according to claim 17, further comprising:

a third nanosheet field-effect transistor device adjacent the second field-effect transistor nanosheet device, the third field-effect transistor nanosheet device comprising a plurality of third nanosheet channel layers disposed on the substrate;

a second source/drain region disposed between opposing sidewalls of the plurality of second nanosheet channel layers and the plurality of third nanosheet channel layers and extending into the substrate and a backside interlevel dielectric layer; and a backside contact disposed on a portion of sidewalls and a bottom surface of the second source/drain region extending into the backside interlevel dielectric layer.

* * * * *